United States Patent
Kubota et al.

(10) Patent No.: US 11,971,567 B2
(45) Date of Patent: Apr. 30, 2024

(54) OPTICAL FILM, POLARIZING PLATE, IMAGE DISPLAY DEVICE, AND OPTICAL FILM SELECTION METHOD

(71) Applicant: DAI NIPPON PRINTING CO., LTD., Tokyo (JP)

(72) Inventors: Shosei Kubota, Kashiwa (JP); Hikaru Hotta, Tsukuba (JP); Yoshiko Tanaka, Tokorozawa (JP); Takashi Kuroda, Moriya (JP); Akinobu Ushiyama, Moriya (JP)

(73) Assignee: DAI NIPPON PRINTING CO., LTD., Tokyo (JP)

( * ) Notice: Subject to any disclaimer, the term of this patent is extended or adjusted under 35 U.S.C. 154(b) by 0 days.

(21) Appl. No.: 18/249,007

(22) PCT Filed: Oct. 21, 2021

(86) PCT No.: PCT/JP2021/038887
§ 371 (c)(1),
(2) Date: Jul. 27, 2023

(87) PCT Pub. No.: WO2022/085751
PCT Pub. Date: Apr. 28, 2022

(65) Prior Publication Data
US 2024/0019619 A1     Jan. 18, 2024

(30) Foreign Application Priority Data
Oct. 21, 2020   (JP) ................. 2020-176687

(51) Int. Cl.
G02B 5/30      (2006.01)
G02B 1/111     (2015.01)
G02B 1/14      (2015.01)

(52) U.S. Cl.
CPC .............. G02B 5/305 (2013.01); G02B 1/111 (2013.01); G02B 1/14 (2015.01); G02B 5/3083 (2013.01)

(58) Field of Classification Search
CPC .... G20B 5/3025; G02B 5/3041; G02B 5/305; G02B 5/3083
(Continued)

(56) References Cited
U.S. PATENT DOCUMENTS 10,481,300 B2 * 11/2019 Miyazaki ............... B32B 7/00
10,668,690 B2 *  6/2020 Isojima ............... G09F 9/301
(Continued)

FOREIGN PATENT DOCUMENTS

JP   2007-293325   11/2007
JP   2008-181097    8/2008
(Continued)

OTHER PUBLICATIONS

International Search Report of PCT/JP2021/038887, dated Jan. 11, 2022, 5 pages including English translation.
(Continued)

*Primary Examiner* — Ricky D Shafer
(74) *Attorney, Agent, or Firm* — HSML P.C.

(57) ABSTRACT

Provided is an optical film that can eliminate rainbow unevenness when viewed with the naked eyes and provide favorable color tone uniformity when viewed at an oblique angle. This optical film has a low-refractive index layer on a plastic film, the plastic film has a slow axis that is an axis with the largest refractive index in a plane, and a fast axis that is an axis orthogonal to the slow axis in the plane of the plastic film, and the low-refractive index layer is located on the surface of the optical film. Linearly polarized light is incident, under predetermined conditions, from a surface on a side opposite to the low-refractive index layer of the (Continued)

optical film, and transmitted light of the linearly polarized light is used to measure the a* value and b* value of the L*a*b* color system at 11 measurement points with different angles. The measurements at the 11 measurement points are used to calculate a sum of square of a difference in a* between adjacent measurement points and square of a difference in b* between the adjacent measurement points. The sum was calculated for each of 10 adjacent points. The optical film has a $\Sigma_T$, which indicates a total of the above sums, within a predetermined range.

12 Claims, 5 Drawing Sheets

(58) Field of Classification Search
    USPC .................................................... 359/483.01
    See application file for complete search history.

(56) References Cited

U.S. PATENT DOCUMENTS

| | | | |
|---|---|---|---|
| 10,670,776 B2 * | 6/2020 | Hayashi | ............... B05D 5/06 |
| 2010/0220266 A1 | 9/2010 | Kashima et al. | |
| 2011/0128477 A1 | 6/2011 | Izaki et al. | |
| 2012/0229732 A1 | 9/2012 | Koike et al. | |
| 2015/0192722 A1 | 7/2015 | Asada | |
| 2018/0045857 A1 | 2/2018 | Hayashi et al. | |
| 2021/0405272 A1 | 12/2021 | Isojima et al. | |
| 2022/0091303 A1 | 3/2022 | Kozakai et al. | |
| 2022/0244429 A1 * | 8/2022 | Kato | ............... B32B 7/023 |
| 2022/0365265 A1 | 11/2022 | Kubota et al. | |

FOREIGN PATENT DOCUMENTS

| | | |
|---|---|---|
| JP | 2009-14886 | 1/2009 |
| JP | 2010-204630 | 9/2010 |
| JP | 2011-107198 | 6/2011 |
| JP | 2011-112928 | 6/2011 |
| JP | 2014-235233 | 12/2014 |
| JP | 2015-045874 | 3/2015 |
| JP | 2017-207699 | 11/2017 |
| JP | 2020-79884 | 5/2020 |
| JP | 2020-166236 | 10/2020 |
| JP | 2021/065978 | 4/2021 |
| WO | 2007/111313 | 10/2007 |
| WO | 2013/035627 | 3/2013 |
| WO | 2016/152691 | 9/2016 |
| WO | 2020/100926 | 5/2020 |

OTHER PUBLICATIONS

Written Opinion of PCT/JP2021/038887, dated Jan. 11, 2022, 10 pages including English translation.
"Highly transparent polyester film Cosmoshine," Seikei-Kakou, The Japan Society of Polymer Processing, vol. 19, No. 10, p. 654, 2007; machine translation provided; Available at: https://www.jstage.jst.go.jp/article/seikeikakou/19/10/19_654/_pdf.

* cited by examiner

[Fig. 1]
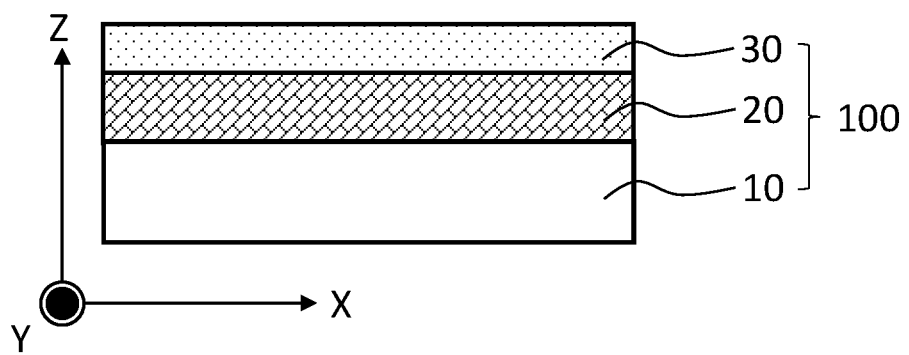

[Fig. 2]
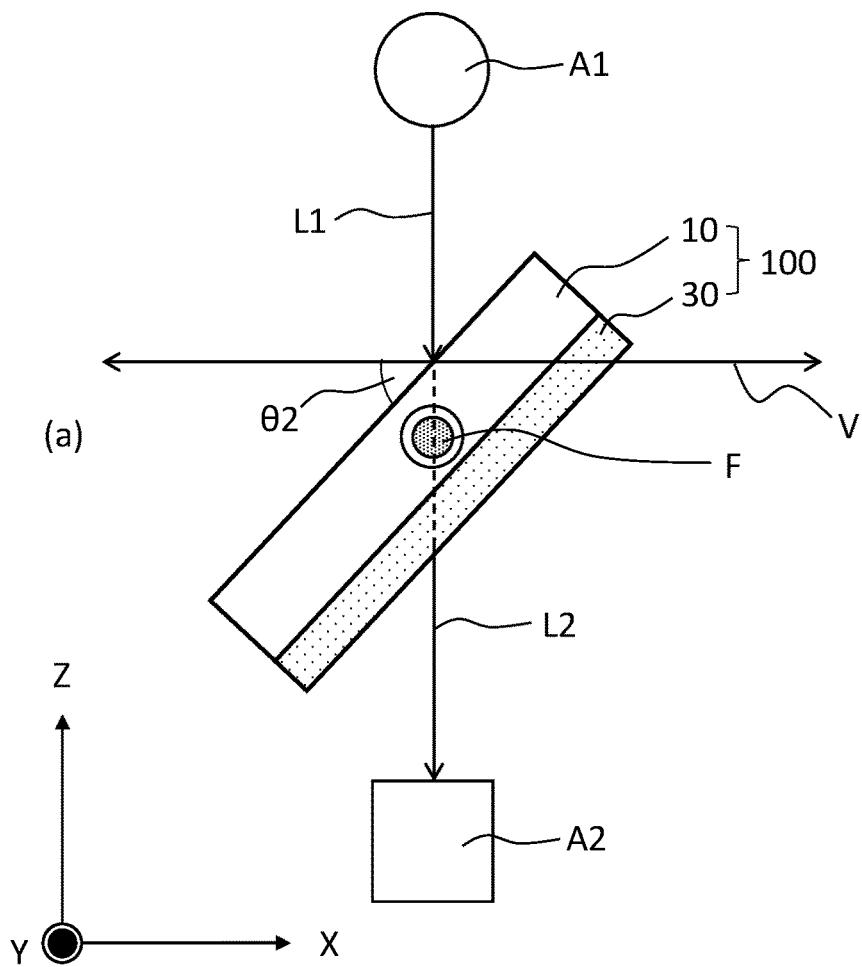
(a)
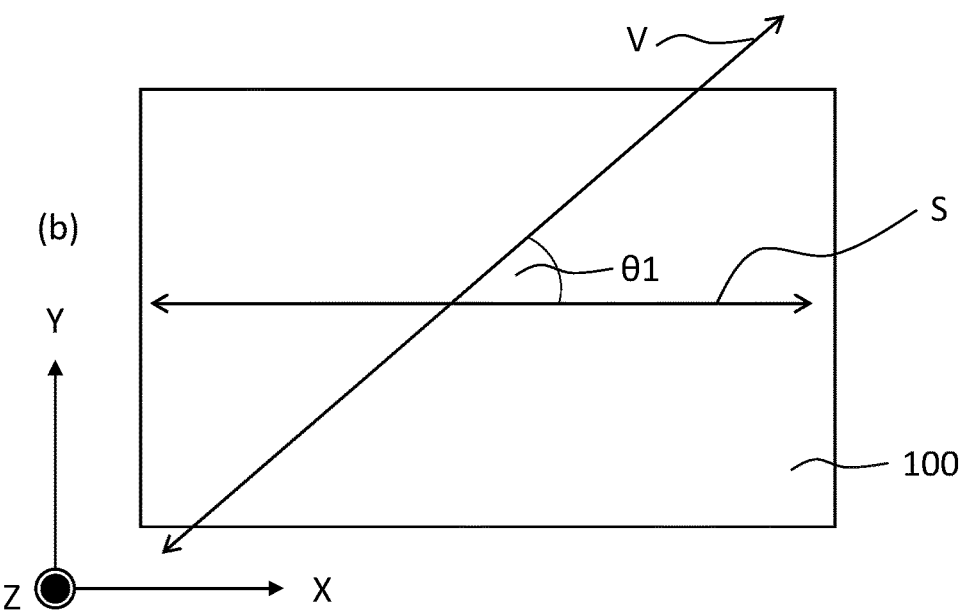
(b)

[Fig. 3]
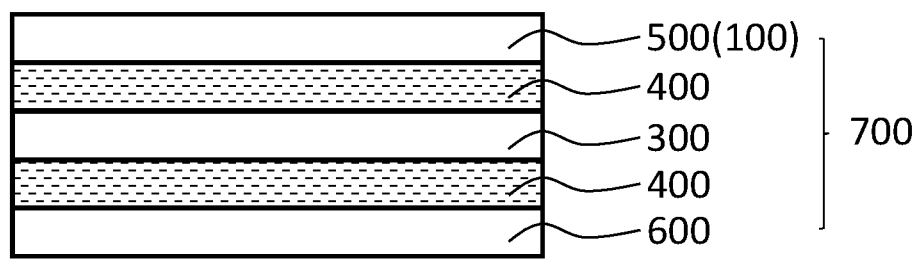
[Fig. 4]
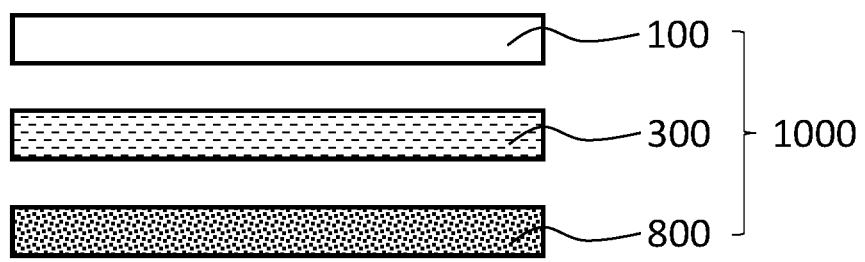
[Fig. 5]
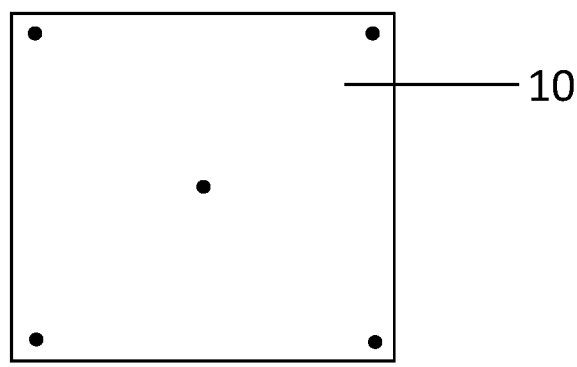

[Fig. 6]
(A)
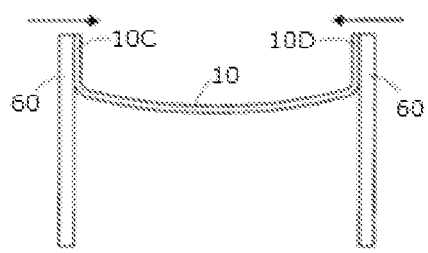
(B)
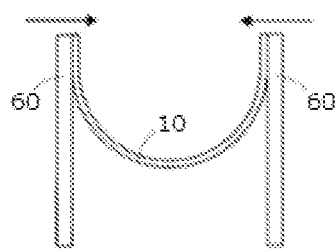
(C)
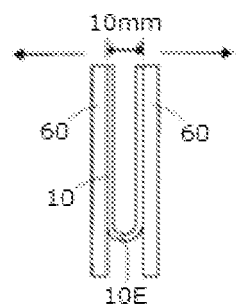

[Fig. 7]
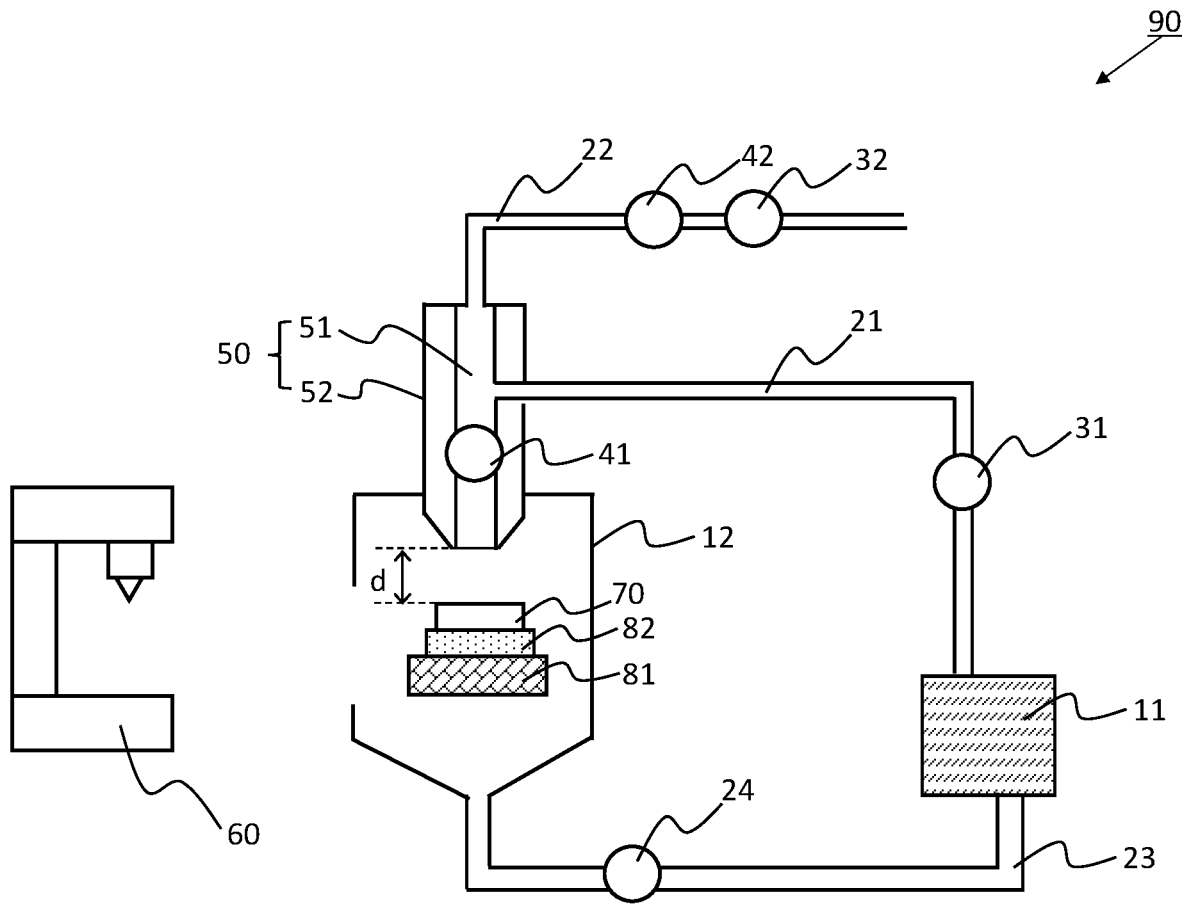
[Fig. 8]
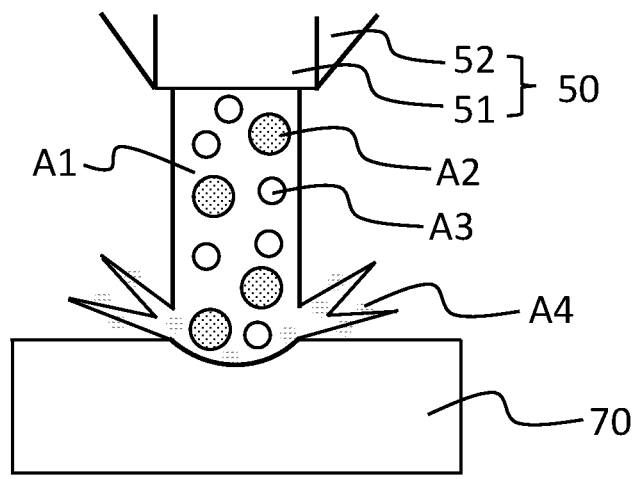

OPTICAL FILM, POLARIZING PLATE, IMAGE DISPLAY DEVICE, AND OPTICAL FILM SELECTION METHOD

TECHNICAL FIELD

The present disclosure relates to an optical film, a polarizing plate, an image display device, and a method for selecting an optical film.

BACKGROUND ART

For optical members such as image display devices, various optical plastic films are often used. For example, a plastic film is used for protecting a polarizer constituting the polarizing plate in an image display device having a polarizing plate on a display element. As used herein, the wording "plastic film for protecting a polarizer" is sometimes referred to as a "polarizer protective film".

Plastic films for image display devices used as such polarizer protective films preferably have excellent mechanical strength. Therefore, stretched plastic films are preferably used as plastic films for image display devices.

In the case of disposing a stretched plastic film on a polarizer, a problem is that rainbow pattern unevenness is observed due to the stretched plastic film disturbing the polarization state of the linearly polarized light that has passed through the polarizer. In order to solve the problem of rainbow unevenness, the technologies of Patent Literatures 1 to 3, for instance, have been proposed. Hereinafter, the "rainbow pattern unevenness" may be referred to as "rainbow unevenness" in this description.

Patent Literature 1 discloses a liquid crystal display device that can eliminate rainbow unevenness when viewing an image through polarized sunglasses by using a specific white light source as a light source of the image display device, setting the in-plane phase difference (retardation) of the stretched plastic film as high as 3000 nm or more and 30000 nm or less, and disposing the absorption axis of the polarizer and the slow axis of the stretched plastic film at substantially 45 degrees.

However, the device of Patent Literature 1 needs to use a stretched plastic film having large in-plane phase difference. Further, a stretched plastic film having large in-plane phase difference is generally uniaxially stretched and therefore has problems such as easy tearing in the stretching direction.

Patent Literature 2 discloses a polarizing plate protective film having a specific range of reflectance at Brewster's angle. Patent Literature 3 discloses a polarizing plate protective film in which the difference between the reflectance of P waves at an incident angle of 50 degrees and the reflectance of S waves is 20% or less.

The polarizing plate protective films of Patent Literature 2 and 3 aim to eliminate rainbow unevenness when viewed with the naked eyes by reducing the reflectance difference between the P waves and the S waves, which are polarization components of the light directed toward the viewer from the inside of the image display device, without increasing the in-plane phase difference of the film as in Patent Literature 1.

The polarizing plate protective films of Patent Literature 2 and 3 can improve the rainbow unevenness to some extent when viewed with the naked eyes. Unfortunately, in the polarizing plate protective films of Patent Literature 2 and 3, the color tone changes depending on the viewing angle. In other words, the polarizing plate protective films of Patent Literature 2 and 3 were not satisfactory in terms of color tone uniformity when viewed at an oblique angle.

CITATION LIST

Patent Literature

PTL 1: JP 2011-107198 A
PTL 2: JP 2009-14886 A
PTL 3: JP 2010-204630 A

SUMMARY OF INVENTION

Technical Problem

It is an object of the present disclosure to provide an optical film that can eliminate rainbow unevenness when viewed with the naked eyes and provide favorable color tone uniformity when viewed at an oblique angle, and a polarizing plate and an image display device that use the optical film. Further, it is another object of the present disclosure to provide a method for selecting an optical film that can eliminate rainbow unevenness when viewed with the naked eyes and provide favorable color tone uniformity when viewed at an oblique angle.

Solution to Problem

The present disclosure provides [1] to [12] below.

[1] An optical film comprising a low-refractive index layer on a plastic film, wherein
  the plastic film has a slow axis that is an axis with a largest refractive index in a plane, and a fast axis that is an axis orthogonal to the slow axis in the plane of the plastic film,
  the low-refractive index layer is located on a surface of the optical film, and
  the optical film comprises a region in which $\Sigma T$ calculated from the following measurement condition 1 satisfies more than 0.04 and less than 0.20:

<Measurement Condition 1>
  when linearly polarized light is incident from a surface on a side opposite to the low-refractive index layer of the optical film; the linearly polarized light that is incident light is defined as light L1; transmitted light that is the light L1 transmitting through the optical film is defined as light L2;
  the light L1 is incident on the optical film at angles disposed such that an elevation angle in a vibration direction of the light L1 with respect to the plane of the optical film is 50 degrees or more and 70 degrees or less while an angle formed by the slow axis and the vibration direction of the light L1 is fixed at 45 degrees; the elevation angle is varied in a range of 50 degrees or more and 70 degrees or less by every 2 degrees, and the light L2 is subject to measurements at 11 different elevation angles; the light L2 is measured at 11 measurement points as in the measurements;
  the light L2 is subject to conversion into conditions of a C light source and at a viewing angle of 2 degrees; a* value and b* value at an $n^{th}$ measurement point among the 11 measurement points of the light L2 and in an L*a*b* color system are defined as a*n and b*n, respectively; a* value and b* value at an $(n+1)^{th}$ measurement point among the 11 measurement points of the light L2 and in the L*a*b* color system are also defined as a*n1 and b*n1, respectively; and the measurements at the 11 measurement points are used to calculate a sum of square of a difference in a* between adjacent measurement points and square of a difference in b* between the adjacent measurement points; and the sum is calculated for each of 10 adjacent points and $E_T$ indicating a total of the sums is calculated, the $\Sigma T$ can be expressed by the following formula 1:

$$\Sigma_T = \Sigma[\{a^*n - a^*n1\}^2 + \{b^*n - b^*n1\}^2] \quad \text{(formula 1)}.$$

[2] The optical film according to [1], wherein when a maximum value of a* is defined as a*max, a minimum value of a* as a*min, a maximum value of b* as b*max, and a minimum value of b* as b*min based on the measurements at the 11 measurement points, the following formulas 2-1 and 2-2 are satisfied:

$$a^*\max - a^*\min \leq 0.250 \quad \text{(formula 2-1); and}$$

$$b^*\max - b^*\min \leq 0.350 \quad \text{(formula 2-2)}.$$

[3] The optical film according to [1] or [2], wherein when the measurements at the 11 measurement points are used to calculate a sum of square of a difference in a* between adjacent measurement points and square of a difference in b* between the adjacent measurement points, and when the sum is defined as S, S can be expressed by the following formula 3; and when S is calculated for each of 10 adjacent points and the maximum value of S among the 10 points is defined as $S_{MAX}$, $S_{MAX}$ is 0.010 or more and 0.050 or less:

$$S = \{a^*n - a^*n1\}^2 + \{b^*n - b^*n1\}^2 \quad \text{(formula 3)}.$$

[4] The optical film according to any one of [1] to [3], wherein when a visual reflectance Y value of the optical film is defined as R (%), a product of R and $\Sigma_T$ is 0.05 or more and 0.25 or less.

[5] The optical film according to any one of [1] to [4], wherein when an average refractive index of the low-refractive index layer is defined as n1 and an average refractive index of a layer adjacent to the low-refractive index layer is defined as n2, n2/n1 is less than 1.23.

[6] The optical film according to any one of [1] to [4], wherein when an average refractive index of the low-refractive index layer is defined as n1 and an average refractive index of a layer adjacent to the low-refractive index layer is defined as n2, n2/n1 is 1.05 or more and less than 1.23.

[7] The optical film according to any one of [1] to [6], wherein an in-plane phase difference of the plastic film is 2500 nm or less.

[8] The optical film according to any one of [1] to [7], wherein the plastic film satisfies the following condition A:

<Condition A> when a sample of 50 mm in vertical×50 mm in horizontal in size is cut out from the plastic film; a total of five points are selected as measurement points, including 1 point at a center of the sample and 4 points at 10 mm from four corners of the sample toward the center; and when slow axis directions at the five points of the sample are measured; and angles formed by any side of the sample with the slow axis direction at the measurement points are respectively defined as D1, D2, D3, D4, and D5, a difference between a maximum value of D1 to D5 and a minimum value of D1 to D5 is 1.5 degrees or more.

[9] The optical film according to any one of [1] to [8], comprising, between the plastic film and the low-refractive index layer, one or more layers selected from the group consisting of a hard coating layer and an anti-glare layer.

[10] A polarizing plate comprising: a polarizer; a first transparent protective plate disposed on one side of the polarizer; and a second transparent protective plate disposed on the other side of the polarizer, wherein at least one selected from the group consisting of the first transparent protective plate and the second transparent protective plate is the optical film according to any one of [1] to [9], and a surface on the low-refractive index layer side of the optical film faces a side opposite to the polarizer.

[11] An image display device comprising: a display element; and a polarizer and an optical film disposed on a light emitting surface side of the display element, wherein the optical film is the optical film according to any one of [1] to [7], and a surface on the low-refractive index layer side of the optical film faces a side opposite to the display element.

[12] A method for selecting an optical film of an image display device comprising a display element, and a polarizer and an optical film disposed on a light emitting surface side of the display element, the method comprising selecting, as the optical film, an optical film X satisfying the following determination conditions (1) to (4):

(1) the optical film X comprises a low-refractive index layer on a plastic film;

(2) the plastic film has a slow axis that is an axis with a largest refractive index in a plane, and a fast axis that is an axis orthogonal to the slow axis in the plane of the plastic film;

(3) the low-refractive index layer is located on a surface of the optical film X; and (4) the optical film X comprises a region in which $E_T$ calculated from the measurement condition 1 satisfies more than 0.04 and less than 0.20.

Advantageous Effects of Invention

The optical film of the present disclosure and the polarizing plate and the image display device that use the optical film can eliminate rainbow unevenness when viewed with the naked eyes and provide favorable color tone uniformity when viewed at an oblique angle. The method for selecting an optical film according to the present disclosure can select efficiently an optical film that can eliminate rainbow unevenness when viewed with the naked eyes and provide favorable color tone uniformity when viewed at an oblique angle.

BRIEF DESCRIPTION OF DRAWINGS

FIG. 1 is a sectional view showing one embodiment of the optical film of the present disclosure.

FIG. 2 is a schematic diagram for describing an example of measurement performed under measurement condition 1.

FIG. 3 is a sectional view showing one embodiment of the polarizing plate of the present disclosure.

FIG. 4 is a sectional view showing one embodiment of the image display device of the present disclosure.

FIG. 5 is a plan view for describing the five measurement positions in a sample when calculating the in-plane phase difference or the like from the sample.

FIG. 6 (A)-(C) are diagrams schematically showing the repeated folding test.

FIG. 7 is a schematic sectional view of the device for measuring an erosion rate.

FIG. 8 is an image diagram showing the state of abrasion of a plastic film by using a test solution containing pure water and spherical silica as jetted from a jetting section.

DESCRIPTION OF EMBODIMENTS

Hereinafter, an embodiment of an optical film of the present disclosure will be described.

[Optical Film]

The optical film of the present disclosure has a low-refractive index layer on a plastic film. The plastic film has a slow axis that is an axis with the largest refractive index in a plane, and a fast axis that is an axis orthogonal to the slow axis in the plane of the plastic film. The low-refractive index layer is located on a surface of the optical film. The optical film has a region in which $\Sigma_T$ calculated from the following measurement condition 1 satisfies more than 0.04 and less than 0.20.

<Measurement Condition 1>

When linearly polarized light is incident from a surface on a side opposite to the low-refractive index layer of the optical film; the linearly polarized light that is incident light is defined as light L1; transmitted light that is the light L1 transmitting through the optical film is defined as light L2;

the light L1 is incident on the optical film at angles disposed such that an elevation angle in a vibration direction of the light L1 with respect to the plane of the optical film is 50 degrees or more and 70 degrees or less while an angle formed by the slow axis and the vibration direction of the light L1 is fixed at 45 degrees; the elevation angle is varied in a range of 50 degrees or more and 70 degrees or less by every 2 degrees, and the light L2 is subject to measurements at 11 different elevation angles; the light L2 is measured at 11 measurement points as in the measurements;

the light L2 is subject to conversion into conditions of a C light source and at a viewing angle of 2 degrees; a* value and b* value at an $n^{th}$ measurement point among the 11 measurement points of the light L2 and in an L*a*b* color system are defined as a*n and b*n, respectively; a* value and b* value at an $(n+1)^{th}$ measurement point among the 11 measurement points of the light L2 and in the L*a*b* color system are also defined as a*n1 and b*n1, respectively; and the measurements at the 11 measurement points are used to calculate a sum of square of a difference in a* between adjacent measurement points and square of a difference in b* between the adjacent measurement points; and the sum is calculated for each of 10 adjacent points and $\Sigma_T$ indicating a total of the sums is calculated, the $\Sigma_T$ can be expressed by the following formula 1:

$$\Sigma_T = Y[\{a^*n - a^*n1\}^2 + \{b^*n - b^*n1\}^2] \quad \text{(formula 1)}.$$

As used herein, measurements under measurement condition 1 as well as measurements described below (measurements of the in-plane phase difference, the phase difference in the thickness direction, the slow axis direction, the visual reflectance Y value, etc.) should be performed at a temperature of 23° C.±5° C. and a relative humidity of 40% or more and 65% or less, unless otherwise particularly noted. In addition, the measurement samples should be exposed to the above atmosphere for from 30 minutes or more and 60 minutes or less before each measurement.

As used herein, a* value and b* value are based on the L*a*b* color system standardized by the International Commission on Illumination (CIE) in 1976. The L*a*b* color system is adopted in JIS Z8781-4:2013.

FIG. 1 is a sectional view showing an embodiment of the optical film 100 of the present disclosure. As shown in FIG. 1, the optical film 100 of the present disclosure has a low-refractive index layer 30 on a plastic film 10.

The optical film 100 of the present disclosure may have a layer other than the plastic film 10 and the low-refractive index layer 30. Examples of the layer other than the plastic film 10 and the low-refractive index layer 30 include a hard coating layer, an anti-glare layer, and a high-refractive index layer. The optical film 100 of FIG. 1 has a hard coating layer 20 between the plastic film 10 and the low-refractive index layer 30.

As used herein, the wording "in a plane of the plastic film" means "in a plane orthogonal to the thickness direction of the plastic film" unless otherwise particularly noted. In the case of FIG. 1, the XY plane of the plastic film corresponds to the wording "in a plane of the plastic film".

<<About Measurement Condition 1>>

FIG. 2 is a schematic diagram showing one example of the measurement performed under measurement condition 1.

In condition 1, light L1, namely linearly polarized light, is incident from a surface on a side opposite to the low-refractive index layer of the optical film. In FIG. 2(a), an optical film 100 is placed between a light source A1 and a detector A2. In FIG. 2(a), light L1, namely linearly polarized light, is emitted from the light source and the light L1 is incident on a surface on a side opposite to the low-refractive index layer 30 of the optical film 100.

A detector capable of detecting a specular transmission light of light L1 is used as the detector.

Under measurement condition 1, the light L1 is incident on the optical film 100 while an angle formed by the slow axis of the plastic film and the vibration direction of the light L1 is fixed at 45 degrees. FIG. 2(b) is a diagram when FIG. 2(a) is viewed from the XY-plane direction, provided that "S" is the slow axis of the plastic film and "V" is the vibration direction of the light L1. In FIG. 2(b), θ1 indicates the angle formed by "S", the slow axis of the plastic film, and "V", the vibration direction of light L1. In measurement condition 1, θ1 is fixed at 45 degrees. Note that "V", the vibration direction of the light L1, is actually tilted toward the Z-axis.

Under measurement condition 1, the light L1 is incident on the optical film at angles disposed such that the elevation angle in the vibration direction of the light L1 with respect to the plane of the optical film is 50 degrees or more and 70 degrees or less while θ1 is fixed at 45 degrees. In FIG. 2(a), θ2 indicates the elevation angle of "V", which is the vibration direction of light L1 with respect to the plane of the optical film (the plane of the optical film is set as the reference, 0 degrees). In FIG. 2(a), "F" indicates the fast axis of the optical film. In FIG. 2(a), the fast axis "F" extends towards the Y-axis direction in FIG. 2(a).

Under measurement condition 1, the elevation angle is varied in a range of 50 degrees or more and 70 degrees or less by every 2 degrees, and the light L2 is subject to measurements at 11 different elevation angles. The light L2 is measured at 11 measurement points as in the measurements. Examples of the means for varying the elevation angle in a range of 50 degrees or more and 70 degrees or less by every 2 degrees include a means for tilting the optical film 100 while the fast axis "F" is used as the rotation center.

In measurement condition 1, the elevation angle is set 50 degrees or more and 70 degrees or less because Brewster's angle of the plastic film such as a polyester film is considered. Rainbow unevenness of the plastic film as observed with the naked eyes is more strongly visible at or near the Brewster's angle.

Under measurement condition 1, the light L2 is subject to conversion into conditions of a C light source and at a viewing angle of 2 degrees. The a* and b* values obtained by the above conversion enable the influence of the light source to be excluded.

Here, a* value and b* value at an $n^{th}$ measurement point among the 11 measurement points of the light L2 and in the L*a*b* color system are defined as a*n and b*n, respectively; and a* value and b* value at an $(n+1)^{th}$ measurement point among the 11 measurement points of the light L2 and in the L*a*b* color system are also defined as a*n1 and b*n1, respectively. The a*n, b*n, a*n1 and b*n1 are calculated from the light L2 after the above conversion.

The above measurements and calculations can be performed, for example, with a JASCO Corporation spectrophotometer product number "V-7100".

Under measurement condition 1, the measurements at the above 11 measurement points are used to calculate a sum of square of a difference in a* between adjacent measurement points and square of a difference in b* between the adjacent measurement points; the sum is calculated for each of 10 adjacent points and $\Sigma_T$ indicating a total of the sums is calculated. Then, the $\Sigma_T$ can be expressed by the following formula 1:

$$\Sigma_T = \Sigma[\{a^*n - a^*n1\}^2 + \{b^*n - b^*n1\}^2] \quad \text{(formula 1)}.$$

The optical film of the present disclosure is required to have a region in which the $\Sigma_T$ satisfies more than 0.04 and less than 0.20.

The above $\Sigma_T$ indicates the amount of change in hue of the transmitted light when the optical film is viewed at an angle of 50 degrees or more and 70 degrees or less. The present inventors have found out that the $\Sigma_T$ is an indicator of the visibility of rainbow unevenness in the optical film with a low-refractive index layer on a plastic film. The present inventors have also found out the tendency where the lower the reflectance of the optical film with a low-refractive index layer on a plastic film, the smaller the $\Sigma_T$ and the less visible the rainbow unevenness. The rainbow unevenness is based on transmitted light.

Based on the above-mentioned findings of the present inventors, it is considered that as the $\Sigma_T$ becomes smaller, the visibility can be made better. However, the present inventors have found out that as the $\Sigma_T$ becomes smaller, the color tone is more likely to change when viewed at an oblique angle, resulting in a problem of reduced uniformity of the color tone. The present inventors have also found out that the main reason why color tone uniformity is reduced due to reflected light, but not transmitted light. Then, the present inventors have found out that by setting the $\Sigma_T$ to within a specified range, the rainbow unevenness when viewed with the naked eyes can be eliminated and favorable color tone uniformity when viewed at an oblique angle can be achieved. The $\Sigma_T$ is set to a predetermined value or higher means that the reflectance of the optical film with a low-refractive index layer is increased. The present inventors have found out that by deliberately increasing the reflectance of the optical film with a low-refractive index layer, the rainbow unevenness when viewed with the naked eyes can be eliminated and the color tone uniformity when viewed at an oblique angle can be made better to solve the problems. By setting the $\Sigma_T$ to a predetermined value or higher, interference of light reflected on the optical film with a low-refractive index layer is suppressed. This seems to facilitate favorable color tone uniformity when viewed at an oblique angle (As the $\Sigma_T$ increases, the refractive index of the low-refractive index layer tends to become higher. As the refractive index of the low-refractive index layer becomes higher, the refractive index difference between the low-refractive index layer and a layer in contact with the low-refractive index layer tends to become smaller. This can suppress interference of light reflected on the optical film. As a result, the color tone uniformity when viewed at an oblique angle seems to be made better).

When the $\Sigma_T$ is 0.04 or less, the interference of reflected light becomes strong and the favorable color tone uniformity when viewed at an oblique angle cannot thus be achieved. When the $\Sigma_T$ is 0.20 or more, the rainbow unevenness when viewed with the naked eyes cannot be eliminated. As described previously, the rainbow unevenness is based on transmitted light. Therefore, by setting the $\Sigma_T$ to more than 0.04 and less than 0.20, the effects of both transmitted and reflected light can be suppressed, resulting in extremely good visibility.

The $\Sigma_T$ is preferably 0.05 or more and more preferably 0.06 or more. The $\Sigma_T$ is preferably 0.15 or less, more preferably 0.10 or less, and still more preferably 0.09 or less.

Examples of the preferable $\Sigma_T$ range in the optical film of the present disclosure include more than 0.04 and 0.15 or less, more than 0.04 and 0.10 or less, more than 0.04 and 0.09 or less, 0.05 or more and less than 0.20, 0.05 or more and 0.15 or less, 0.05 or more and 0.10 or less, 0.05 or more and 0.09 or less, 0.06 or more and less than 0.20, 0.06 or more and 0.15 or less, 0.06 or more and 0.10 or less, or 0.06 or more and 0.09 or less.

As the refractive index of the low-refractive index layer increases, the $\Sigma_T$ tends to become larger. As the refractive index of the low-refractive index layer decreases, the $\Sigma_T$ tends to become smaller. As the refractive index of the low-refractive index layer becomes lower, the mechanical strength of the low-refractive index layer tends to decrease. As the refractive index of the low-refractive index layer becomes higher, the reflectance of the optical film is likely to increase. The $\Sigma_T$ is preferably 0.05 or more and 0.09 or less to achieve the reflectance of the optical film should be set to within an appropriate range and the mechanical strength of the low-refractive index layer should be made favorable.

The $\Sigma_T$ can be easily set to the above range by "lowering the in-plane phase difference of the plastic film" and "reducing n2/n1, a parameter for the refractive index". In the case of having a hard coating layer between the plastic film and the low-refractive index layer, the use of a polyfunctional (meth)acrylate oligomer with a molecular weight in a predetermined range as an ionizing radiation curable compound for forming the hard coating layer makes it easier to set the $\Sigma_T$ to within the above range.

The percentage of a region in which the $\Sigma_T$ satisfies more than 0.04 and less than 0.20 in the optical film is preferably 50% or higher, more preferably 70% or higher, still more preferably 90% or higher, and still more preferably 100%.

Similarly, the percentage of a region in which various parameters (e.g., formula 2-1, formula 2-2, the in-plane phase difference, the phase difference in the thickness direction) other than the $\Sigma_T$ are satisfied is preferably 50% or higher, more preferably 70% or higher, still more preferably 90% or higher, and still more preferably 100%.

When the maximum value of a* is defined as a*max, the minimum value of a* as a*min, the maximum value of b* as b*max, and the minimum value of b* as b*min based on the measurements at the 11 measurement points, the optical film of the present disclosure preferably satisfies the following formulas 2-1 and 2-2:

$$a*\text{max} - a*\text{min} \leq 0.250 \quad \text{(formula 2-1); and}$$

$$b*\text{max} - b*\text{min} \leq 0.350 \quad \text{(formula 2-2)}.$$

When formulas 2-1 and 2-2 are satisfied, the change in hue of transmitted light in the range 50 degrees or more and 70 degrees or less can be made less perceptible. Therefore, by satisfying formulas 2-1 and 2-2, the rainbow unevenness when viewed with the naked eyes can be more easily eliminated.

When the $\Sigma_T$ becomes too small, the left sides of formulas 2-1 and 2-2 tend to become larger. This may be because as the $\Sigma_T$ becomes smaller, the color change is mainly controlled by the change in optical distance in the low-refractive index layer. More specifically, the optical distance in the low-refractive index layer varies linearly with angle. This may cause the a* and b* values to monotonically increase or decrease. Therefore, when formulas 2-1 and 2-2 are satisfied, the color tone uniformity when viewed at an oblique angle is more likely to improve.

The (a*max−a*min) of formula 2-1 is more preferably 0.230 or less, still more preferably 0.210 or less, and still more preferably 0.200 or less. The lower limit of (a*max−a*min) in formula 2-1 is not particularly limited, and is around 0.070. When (a*max−a*min) is set to 0.070 or more, the $\Sigma_T$ can be easily prevented from becoming too large.

The (b*max−b*min) of formula 2-2 is more preferably 0.300 or less, still more preferably 0.250 or less, still more preferably 0.230 or less, still more preferably 0.210 or less, and still more preferably 0.200 or less. The lower limit of (b*max−b*min) in formula 2-2 is not particularly limited, and is around 0.070. When (b*max−b*min) is set to 0.070 or more, the $\Sigma_T$ can be easily prevented from becoming too large.

Examples of the preferable range of (a*max−a*min) in formula 2-1 include 0.070 or more and 0.250 or less, 0.070 or more and 0.230 or less, 0.070 or more and 0.210 or less, or 0.070 or more and 0.200 or less.

Examples of the preferable range of (b*max−b*min) in formula 2-2 include 0.070 or more and 0.350 or less, 0.070 or more and 0.300 or less, 0.070 or more and 0.250 or less, 0.070 or more and 0.230 or less, 0.070 or more and 0.210 or less, or 0.070 or more and 0.200 or less.

Formulas 2-1 and 2-2 can be easily met by "lowering the in-plane phase difference of the plastic film" and "reducing n2/n1, a parameter for the refractive index". In the case of having a hard coating layer between the plastic film and the low-refractive index layer, the use of a polyfunctional (meth)acrylate oligomer with a molecular weight in a predetermined range as an ionizing radiation curable compound for forming the hard coating layer makes it easier to satisfy formulas 2-1 and 2-2.

The a*max is preferably −1.0 or more and 0 or less, and more preferably −0.8 or more and −0.1 or less.

The b*max is preferably 0 or more and 2.0 or less, and more preferably 0.2 or more and 1.8 or less.

An optical film of the present disclosure preferably satisfy the following configuration:
when the measurements at the above 11 measurement points are used to calculate a sum of square of a difference in a* between adjacent measurement points and square of a difference in b* between the adjacent measurement points, and when the sum is defined as S, S can be expressed by the following formula 3; and when S is calculated for each of 10 adjacent points and the maximum value of S among the 10 points is defined as $S_{MAX}$, $S_{MAX}$ is preferably 0.010 or more and 0.050 or less.

$$S = \{a*n - a*n1\}^2 + \{b*n - b*n1\}^2 \quad \text{(formula 3)}$$

When $S_{MAX}$ is set to 0.050 or less, the change in hue of transmitted light in the range 50 degrees or more and 70 degrees or less can be made less perceptible. Therefore, by setting $S_{MAX}$ to 0.050 or less, the rainbow unevenness when viewed with the naked eyes can be more easily eliminated.

As the reflectance of optical film with a low-refractive index layer decreases, $S_{MAX}$ tends to become smaller. That is, too small $S_{MAX}$ tends to make it difficult to suppress the interference of light reflected on the optical film with a low-refractive index layer. Therefore, $S_{MAX}$ is set to 0.010 or more. This facilitates better color tone uniformity when viewed at an oblique angle.

The lower limit of $S_{MAX}$ is more preferably 0.011 or higher and still more preferably 0.012 or higher. The upper limit of $S_{MAX}$ is more preferably 0.040 or less, still more preferably 0.030 or less, and still more preferably 0.025 or less.

Examples of the preferable range of $S_{MAX}$ include 0.010 or more and 0.040 or less, 0.010 or more and 0.030 or less, 0.010 or more and 0.025 or less, 0.011 or more and 0.050 or less, 0.011 or more and 0.040 or less, 0.011 or more and 0.030 or less, 0.011 or more and 0.025 or less, 0.012 or more and 0.050 or less, 0.012 or more and 0.040 or less, 0.012 or more and 0.030 or less, or 0.012 or more and 0.025 or less.

By setting $S_{MAX}$ to 0.010 or more and 0.040 or less, the increase in b* can be suppressed and a loss of luxurious feel of the image display device can be prevented.

$S_{MAX}$ can be easily set to the above range by "lowering the in-plane phase difference of the plastic film" and "reducing n2/n1, a parameter for the refractive index". In the case of having a hard coating layer between the plastic film and the low-refractive index layer, the use of a polyfunctional (meth)acrylate oligomer with a molecular weight in a predetermined range as an ionizing radiation curable compound for forming the hard coating layer makes it easier to set $S_{MAX}$ to within the above range.

When a visual reflectance Y value of the optical film in the present disclosure is defined as R (%), a product of R and $\Sigma_T$ is preferably 0.05 or more and 0.25 or less.

By setting the above product to 0.05 or more and 0.25 or less, the effect based on the above $\Sigma_T$ can be more easily exerted.

The above product is more preferably 0.06 or higher and still more preferably 0.07 or higher. The above product is more preferably 0.19 or less, still more preferably 0.13 or less, and still more preferably 0.11 or less. In particular, when the above product is 0.11 or less, it is easy to provide a better luxurious feel of the image display device.

Examples of the preferable range of the above product include 0.05 or more and 0.19 or less, 0.05 or more and 0.13 or less, 0.05 or more and 0.11 or less, 0.06 or more and 0.25 or less, 0.06 or more and 0.19 or less, 0.06 or more and 0.13 or less, 0.06 or more and 0.11 or less, 0.07 or more and 0.25 or less, 0.07 or more and 0.19 or less, 0.07 or more and 0.13 or less, or 0.07 or more and 0.11 or less.

<Plastic Film>

Examples of the resin component included in the plastic film include polyester, polyimide, polyethersulfone, polysulfone, polypropylene, polymethylpentene, poly(vinyl chloride), poly(vinyl acetal), poly(ether ketone), poly(methyl methacrylate), polycarbonate, polyurethane, triacetylcellulose (TAC), or amorphous olefin (Cyclo-Olefin-Polymer: COP).

The plastic film has a Brewster's angle of preferably 50 degrees or more and 70 degrees or less, and more preferably 55 or more and 65 degrees or less. In the optical film of the present disclosure, the elevation angle under measurement condition 1 is 50 degrees or more and 70 degrees or less. Therefore, by setting the Brewster's angle of the plastic film to 50 degrees or more and 70 degrees or less, the effect of the present disclosure can be easily achieved.

Examples of a resin with a Brewster's angle of 50 degrees or more and 70 degrees or less include acryl such as polymethyl methacrylate, polyester, TAC, or COP. Among them, polyester is preferable because it is easy to obtain favorable mechanical strength.

Examples of the polyesters include polyethylene terephthalate (PET), polyethylene naphthalate (PEN), and polybutylene terephthalate (PBT). Among these, PET is preferable in that it has low intrinsic birefringence, and thus the in-plane phase difference is easily reduced.

The plastic film optionally contains additives such as a UV absorber, a light stabilizer, an antioxidant, an antistatic agent, a flame retardant, an anti-gelling agent, inorganic particles, organic particles, a pigment, a dye, an antifouling agent, a cross-linker, and a surfactant.

The plastic film is preferably a stretched film and more preferably a biaxially stretched film to improve the mechanical strength. Biaxially stretched films are preferable because tear resistance is better than that of uniaxially stretched films. Thus, the plastic film is preferably a biaxially stretched plastic film.

Examples of the preferable embodiments of the plastic film herein include various embodiments such as the "in-plane phase difference", the "phase difference in the thickness direction", and the "difference between the maximum value of D1 to D5 and the minimum value of D1 to D5". It is more preferable that the optical film of the present disclosure satisfies the preferable embodiments such as the in-plane phase difference when the plastic film is a biaxially stretched plastic film.

To facilitate the suppression of rainbow unevenness, the in-plane phase difference of plastic film preferably be 2500 nm or less. In addition, if the in-plane phase difference of the plastic film is made smaller, the $\Sigma_T$ can be easily decreased.

The in-plane phase difference of the plastic film is more preferably 2000 nm or less, still more preferably 1500 nm or less, still more preferably 1400 nm or less, still more preferably 1250 nm or less, still more preferably 1150 nm or less, still more preferably 1100 nm or less, still more preferably 1000 nm or less, still more preferably 950 nm or less, still more preferably 850 nm or less, and still more preferably 600 nm or less. The in-plane phase difference of the plastic film can be set to 2000 nm or less to easily decrease the $\Sigma_T$. In addition, in case of the refractive index in the slow axis direction of the plastic film differ from that in the fast axis direction, the reflectance of the optical film in the slow axis direction become differ from that in the fast axis direction. In order to suppress the difference in the direction-dependent reflectance, it is preferable to reduce the difference in refractive index between the slow axis direction and the fast axis direction of the plastic film. Due to this, the in-plane phase difference of the plastic film is preferably 1250 nm or less.

To improve the mechanical strength, the in-plane phase difference of the plastic film is preferably 20 nm or larger. The in-plane phase difference of the plastic film is preferably 100 nm or larger, more preferably 300 nm or larger, still more preferably 400 nm or larger, and still more preferably 520 nm or larger.

Examples of the preferable range of the in-plane phase difference of the plastic film include 20 nm or more and 2000 nm or less, 20 nm or more and 1500 nm or less, 20 nm or more and 1400 nm or less, 20 nm or more and 1250 nm or less, 20 nm or more and 1150 nm or less, 20 nm or more and 1100 nm or less, 20 nm or more and 1000 nm or less, 20 nm or more and 950 nm or less, 20 nm or more and 850 nm or less, 20 nm or more and 600 nm or less, 100 nm or more and 2000 nm or less, 100 nm or more and 1500 nm or less, 100 nm or more and 1400 nm or less, 100 nm or more and 1250 nm or less, 100 nm or more and 1150 nm or less, 20 nm or more and 1100 nm or less, 100 nm or more and 1000 nm or less, 100 nm or more and 950 nm or less, 100 nm or more and 850 nm or less, 100 nm or more and 600 nm or less, 300 nm or more and 2000 nm or less, 300 nm or more and 1500 nm or less, 300 nm or more and 1400 nm or less, 300 nm or more and 1250 nm or less, 300 nm or more and 1150 nm or less, 300 nm or more and 1100 nm or less, 300 nm or more and 1000 nm or less, 300 nm or more and 950 nm or less, 300 nm or more and 850 nm or less, 300 nm or more and 600 nm or less, 400 nm or more and 2000 nm or less, 400 nm or more and 1500 nm or less, 400 nm or more and 1400 nm or less, 400 nm or more and 1250 nm or less, 400 nm or more and 1150 nm or less, 400 nm or more and 1100 nm or less, 400 nm or more and 1000 nm or less, 400 nm or more and 950 nm or less, 400 nm or more and 850 nm or less, 400 nm or more and 600 nm or less, 520 nm or more and 2000 nm or less, 520 nm or more and 1500 nm or less, 520 nm or more and 1400 nm or less, 520 nm or more and 1250 nm or less, 520 nm or more and 1150 nm or less, 520 nm or more and 1100 nm or less, 520 nm or more and 1000 nm or less, 520 nm or more and 950 nm or less, 520 nm or more and 850 nm or less, or 520 nm or more and 600 nm or less.

In order to keep the in-plane phase difference of plastic film within the above range, it is preferable to keep close the stretching ratio in the longitudinal direction (flow direction) and the stretching ratio in the transverse direction (width direction).

When the in-plane phase difference of the plastic film is in the range of 520 nm or more and 1400 nm or less, it is easier to achieve suppressed rainbow unevenness and reduced $\Sigma_T$ and to improve the mechanical strength of the plastic film. In addition, when the in-plane phase difference of the plastic film is 1250 nm or less, it is easier to suppress the difference in the direction-dependent reflectance.

By setting the in-plane phase difference of the plastic film to 50 nm or more, blackout can be easily suppressed. This is because the plastic film with an average in-plane phase difference of less than 50 nm hardly disrupts linearly polarized light. Thus, the linearly polarized light passes therethrough as it is. On the other hand, in the plastic film with an average in-plane phase difference of 50 nm or more, the linearly polarized light may be disrupted. The blackout means a phenomenon where the entire surface becomes dark when light passing through a polarizer and a plastic film in this order is viewed through polarized sunglasses.

The phase difference (Rth) of the plastic film in the thickness direction is preferably 2000 nm or larger, more preferably 3000 nm or larger, still more preferably 4000 nm or larger, and still more preferably 5000 nm or larger. The upper limit of Rth is about 10000 nm, preferably 8000 nm or less, and more preferably 7000 nm or less. By setting Rth to within the above range, rainbow unevenness can be more easily suppressed. In order to suppress rainbow unevenness, it is especially preferable that the Rth is 5000 nm or larger. To further improve the pencil hardness of the plastic film, the Rth preferably be 5000 nm or larger. To facilitate the suppression of breakage of the plastic film, the Rth preferably be 10000 nm or less.

Examples of the preferable range of the Rth of the plastic film include 2000 nm or more and 10000 nm or less, 2000 nm or more and 8000 nm or less, 2000 nm or more and 7000 nm or less, 3000 nm or more and 10000 nm or less, 3000 nm or more and 8000 nm or less, 3000 nm or more and 7000 nm or less, 4000 nm or more and 10000 nm or less, 4000 nm or more and 8000 nm or less, 4000 nm or more and 7000 nm or less, 5000 nm or more and 10000 nm or less, 5000 nm or more and 8000 nm or less, or 5000 nm or more and 7000 nm or less.

In order to keep the Rth of plastic film within the above range, it is preferable to enlarge the stretching ratios in the longitudinal direction (flow direction) and the transverse direction (width direction). The stretching ratios in the flow direction and the width direction may be enlarged. In this case, the refractive index of the plastic film in the thickness direction becomes smaller. This makes it easier to enlarge the Rth.

By setting the in-plane phase difference and the phase difference in the thickness direction to within the above ranges, the degree of stretching of the plastic film is close to uniform biaxiality, and the mechanical strength of the plastic film can be easily improved.

When the reflective index in the slow axis direction is defined as nx, the reflective index in the fast axis direction as ny, reflective index in the thickness direction of plastic film as nz, the thickness of plastic film as T [nm], the in-plane phase difference (Re) and phase difference in the thickness direction (Rth) of the plastic film can be expressed by the following formulas i and ii;

$$Re=(nx-ny)\times T[nm] \quad \text{(formula i); and}$$

$$Rth=((nx+ny)/2-nz)\times T[nm] \quad \text{(formula ii).}$$

The slow axis direction, the in-plane phase difference, and the phase difference in the thickness direction can be measured, for example, by the product name "RETS-100" of Otsuka Electronics Co., Ltd.

When measuring the in-plane phase difference or the like, using the product name "RETS-100" of Otsuka Electronics Co., Ltd., the measurement is preferably prepared according to the following procedures (A1) to (A4).

(A1) First, the light source is turned on and left standing for 60 minutes or more, in order to stabilize the light source of RETS-100. Thereafter, the rotating-analyzer method is selected, and the θ mode (mode for measuring the angular phase difference and calculating the Rth) is selected. The selection of this θ mode allows the stage to be an inclined rotation stage.

(A2) Then, the following measurement conditions are input into RETS-100.

(Measurement Conditions)
  Retardation measurement range: rotating-analyzer method
  Measurement spot diameter: <φ5 mm
  Inclination angle range: 0°
  Measurement wavelength range: 400 nm or more and 800 nm or less
  Average refractive index of plastic film
  For example, in the case of a PET film, N=1.617. The average refractive index N of the plastic film can be calculated by the formula (N=(nx+ny+nz)/3) based on nx, ny, and nz.
  Thickness: thickness separately measured by SEM or optical microscope (A3) Then, background data is obtained without installing a sample in this device. A closed system is employed as the device, and the same procedure is performed every time the light source is turned on.

(A4) Thereafter, a sample is installed on the stage in the device and measured.

The in-plane phase difference, the phase difference in the thickness direction, and the slow axis direction preferably be determined such that each sample of 50 mm in vertical×50 mm in horizontal in size is cut out from the plastic film and the values measured at five points of the sample are averaged. The 5 measurement points include 1 point at the center of the sample and 4 points at 10 mm from four corners of the sample toward the center of the sample (5 black circles in FIG. 5).

The in-plane phase differences measured at five points of the sample are respectively defined as Re1, Re2, Re3, Re4, and Re5, and the phase differences in the thickness direction measured at five points of the sample are respectively defined as Rth1, Rth2, Rth3, Rth4, and Rth5.

In the plastic film, the average of Re1/Rth1, Re2/Rth2, Re3/Rth3, Re4/Rth4 and Re5/Rth5 is preferably 0.20 or less.

A smaller ratio (Re/Rth) of the in-plane phase difference to the phase difference in the thickness direction means that the biaxial stretching of the plastic film becomes closer to uniform biaxiality. Thus, by setting the Re/Rth to 0.20 or less, it is easier to improve the mechanical strength of the plastic film. The Re/Rth is more preferably 0.18 or less and still more preferably 0.16 or less. The lower limit of Re/Rth is about 0.01.

The Re/Rth of a completely uniaxially stretched plastic film is 2.0. A general purpose uniaxially stretched plastic film is slightly stretched also in the flow direction. Therefore, the Re/Rth of a general purpose uniaxially stretched plastic film is about 1.0.

Re1/Rth1, Re2/Rth2, Re3/Rth3, Re4/Rth4 and Re5/Rth5 are each preferably 0.20 or less, more preferably 0.18 or less, and still more preferably 0.16 or less. The lower limit of these ratios is about 0.01.

A layer and a film, which affect the values for the in-plane phase difference and the phase difference in the thickness direction, may be layered on the plastic film. In this case, the layer and the film are detached, and the in-plane phase difference of the plastic film and the phase difference in the thickness direction may then be measured. Note that the layer formed by coating usually does not affect the values for the in-plane phase difference and the phase difference in the thickness direction.

Examples of a procedure for detaching the layer and the film that affect the values for the in-plane phase difference and the phase difference in the thickness direction include the following procedure.

<Procedure for Detachment>

The detachment procedure includes: soaking a sample of at least 5 cm square in warm water at from 80° C. to 90° C. for 5 minutes; taking out the sample from the warm water and leaving the sample at room temperature for 10 minutes or longer; soaking the sample in warm water for another 5 minutes; taking out the sample from the warm water; cutting a notch in the sample with a cutter or other tool; then using the notch as a start to detach a layer and a film.

In the above procedure, it is preferable to soak the sample in warm water with the edge of the sample attached to, for instance, a metal frame.

The plastic film preferably satisfies the following condition A.

<Condition A>

When the slow axis direction is measured at the five points of the sample, and angles formed by any side of the sample with the slow axis direction at the measurement points are respectively defined as D1, D2, D3, D4, and D5, the difference between the maximum value of D1 to D5 and the minimum value of D1 to D5 is 1.5 degrees or more.

The slow axis of the plastic film may be uniformly oriented. In this case, the $\Sigma_T$ tends to become larger, and the rainbow unevenness tends to be more visible. On the other hand, when the slow axis of the plastic film varies, the rainbow unevenness is blurred and difficult to see. Therefore, satisfying condition A can make it easy to suppress the visibility of rainbow unevenness by the naked eyes. In other words, satisfying condition A can make it easy for the $\Sigma_T$ to satisfy the above-described range.

A general-purpose stretched plastic film is designed so that the slow axis direction is not shifted. However, as described above, when the slow axis of the plastic film is deliberately deviated, it is possible to easily suppress rainbow unevenness. Further, although the effect of suppressing rainbow unevenness is small even if the slow axis varies in a large area, the slow axis varies in a comparatively small area of 50 mm in vertical×50 mm in horizontal, thereby enabling rainbow unevenness to be easily suppressed.

As used herein, the wording "the slow axis direction when the $\Sigma_T$ is calculated" means "the average of the slow axis directions at five points of the sample".

In condition A, the side of the sample to serve as a reference of the angle formed with the slow axis direction may be any of the vertical and horizontal sides of the sample, as long as all of D1 to D5 use the same side as the reference.

Further, the plastic film satisfying condition A is also preferable because the plastic film has favorable folding resistance.

Meanwhile, a general-purpose oriented film with an aligned slow axis but without satisfying condition A tends to break or have a strong folding habit after a folding test. Specifically, the uniaxially stretched film as disclosed in Patent Literature 1 breaks in the case of performing a folding test along the slow axis, whereas it has folding habits strongly remaining in the case of performing a folding test in a direction orthogonal to the slow axis. Further, a general purpose biaxially stretched film has folding habits strongly remaining in the case of performing a folding test in a direction orthogonal to the slow axis.

The plastic film satisfying condition A is preferable in view of preventing a folding habit from remaining and a breakage after the folding test regardless of the folding direction.

Further, the plastic film satisfying condition A is also preferable because microcracks of the plastic film after the folding test can be easily prevented.

Furthermore, the plastic film satisfying condition A is also preferable because the folding resistance of the plastic film can be easily improved even in the case of high pencil hardness.

The difference between the maximum value of D1 to D5 and the minimum value of D1 to D5 is preferably 2.0 degrees or larger, more preferably 3.0 degrees or larger, and still more preferably 3.5 degrees or larger.

When the difference between the maximum value of D1 to D5 and the minimum value of D1 to D5 is excessively large, the orientation of the plastic film tends to be low, and the mechanical strength tends to decrease. Thus, the difference is preferably 20.0 degrees or less, more preferably 17.0 degrees or less, still more preferably 15.0 degrees or less, still more preferably 10.0 degrees or less, still more preferably 9.0 degrees or less, and still more preferably 8.0 degrees or less.

Examples of the preferable range of the difference between the maximum value and the minimum value of D1 to D5 in condition A include 1.5 degrees or more and 20.0 degrees or less, 2.0 degrees or more and 20.0 degrees or less, 3.0 degrees or more and 20.0 degrees or less, 3.5 degrees or more and 20.0 degrees or less, 1.5 degrees or more and 17.0 degrees or less, 2.0 degrees or more and 17.0 degrees or less, 3.0 degrees or more and 17.0 degrees or less, 3.5 degrees or more and 17.0 degrees or less, 1.5 degrees or more and 15.0 degrees or less, 2.0 degrees or more and 15.0 degrees or less, 3.0 degrees or more and 15.0 degrees or less, 3.5 degrees or more and 15.0 degrees or less, 1.5 degrees or more and 10.0 degrees or less, 2.0 degrees or more and 10.0 degrees or less, 3.0 degrees or more and 10.0 degrees or less, 3.5 degrees or more and 10.0 degrees or less, 1.5 degrees or more and 9.0 degrees or less, 2.0 degrees or more and 9.0 degrees or less, 3.0 degrees or more and 9.0 degrees or less, 3.5 degrees or more and 9.0 degrees or less, 1.5 degrees or more and 8.0 degrees or less, 2.0 degrees or more and 8.0 degrees or less, 3.0 degrees or more and 8.0 degrees or less, or 3.5 degrees or more and 8.0 degrees or less.

D1 to D5 of the plastic film are each preferably 5 degrees or more and 30 degrees or less or 60 degrees or more and 85 degrees or less, more preferably 7 degrees or more and 25 degrees or less or 65 degrees or more and 83 degrees or less, further preferably 10 degrees or more and 23 degrees or less or 67 degrees or more and 80 degrees or less.

Setting each of D1 to D5 to 5 degrees or more or 85 degrees or less enables blackout when viewed with polarized sunglasses to be easily suppressed. Further, setting each of D1 to D5 to 30 degrees or less or 60 degrees or more enables the decrease of the mechanical strength due to low orientation of the plastic film to be easily suppressed.

Examples of the plastic film include the case of a sheet-like shape or the case of a roll-like shape. In any case of sheet or roll shape, a sample of 50 mm in vertical×50 mm in horizontal in size may be cut out from any location on the plastic film, as long as it complies with the following criteria.

Provided that if the longitudinal and transverse directions of the sheet or roll are detectable, each sample should be cut along the detected longitudinal and transverse directions. For example, in the case of a roll, the flow direction (MD direction) of the roll can be regarded as the vertical direction, and the width direction (TD direction) of the roll can be regarded as the horizontal direction. Further, in the case where the flow and width directions of the sheet can be confirmed, the flow direction can be regarded as the vertical direction, and the width direction can be regarded as the horizontal direction. In the case where it is difficult to confirm the flow and width directions of the sheet, and the sheet is rectangular or square, the vertical and horizontal directions may be confirmed based on the four sides constituting the rectangle or square. In the case where it is difficult to confirm the flow and width directions of the sheet, and the sheet has a shape other than the rectangular or square shape (such as circles and triangles), a rectangle or square having the maximum area that does not protrude from the outer frame of the sheet is drawn, and the horizontal and vertical directions may be confirmed based on the sides of the rectangular or square drawn.

Each sample should be cut out while excluding 10 mm from the corners of the sheet or roll. In the case of a sheet shape, a sample of 50 mm in vertical×50 mm in horizontal should be cut out by cutting out the four corners of the sheet with the highest priority, followed by the center of the sheet. Next, samples are cut out from the four corners and the center, and a region larger than 50 mm in vertical×50 mm in horizontal may be still present. In this case, samples should be obtained from the remaining region while the largest number of samples of 50 mm in vertical×50 mm in horizontal can be cut out.

Note that multiple samples of 50 mm in vertical×50 mm in horizontal in size may be collected from a sheet-like plastic film. In this case, the percentage of sample satisfying condition A among the multiple samples is preferably 50% or more, more preferably 70% or more, still more preferably 90% or more, and still more preferably 100%. The same applies to other parameters such as the in-plane phase difference, the phase difference in thickness direction, and the Re/Rth.

The properties of the roll-like plastic film tend to change in the width direction, but are almost the same in the flow direction. Here, the sample collected from a given position of the roll in the width direction may satisfy the predetermined physical properties such as condition A. In this case, if the positions in the width direction are the same locations, all the samples in the same flow direction of the role are assumed to satisfy the predetermined physical properties.

The plastic film preferably has no occurrence of crack or breakage after 100,000 times (more preferably after 300,000 times) of the folding test shown in the Examples. A measurement sample was placed on a leveled stand after the plastic film is subjected to 100,000 times (more preferably after 300,000 times) of the folding test shown in the Examples. At that time, the angle at which the edge of the sample is lifted from the stand is preferably 20 degrees or less and more preferably 15 degrees or less. The angle at which the edge of the sample is lifted may be 15 degrees or less. This means that the sample is unlikely to have a folding habit. In any of the directions such as the average slow axis direction and the average fast axis direction of the plastic film, the above-described results are preferably exhibited (it does not crack or break, has no habit due to folding, and has an angle at which the edge of the sample rises after the test of 20 degrees or less).

A uniaxially stretched plastic film breaks in the stretching direction when performing the folding test and has folding habits strongly remaining in a direction orthogonal to the stretching direction. For this reason, biaxially stretched plastic films are preferable among stretched films.

The lower limit of the plastic film thickness is preferably 10 μm or larger, more preferably 15 μm or larger, still more preferably 21 μm or larger, still more preferably 25 μm or larger, and still more preferably 30 μm or larger, and the upper limit is preferably 200 μm or less, more preferably 180 μm or less, still more preferably 150 μm or less, still more preferably 100 μm or less, still more preferably 80 μm or less, still more preferably 60 μm or less, and still more preferably 50 μm or less.

A thickness of 10 μm or more facilitates better mechanical strength. In addition, to reduce moisture permeability and extend the life of the polarizing plate, the thickness is preferably 21 μm or larger and more preferably 30 μm or larger. In addition, when the panel size is large and becomes 50 inches or larger, distortion due to the dead weight of the plastic film tends to occur when the panel is made to stand vertically. In order to suppress the above distortion, the thickness of the plastic film preferably be 30 μm or larger.

When the thickness is 200 μm or less, the in-plane phase difference of the plastic film can be easily set to 2500 nm or less. Further, to make the panel and the image display device thinner, the thickness of the plastic film is preferably 60 μm or less and more preferably 50 μm or less.

Examples of the preferable range of the thickness of the plastic film include 10 μm or more and 200 μm or less, 15 μm or more and 200 μm or less, 21 μm or more and 200 μm or less, 25 μm or more and 200 μm or less, 30 μm or more and 200 μm or less, 10 μm or more and 180 μm or less, 15 μm or more and 180 μm or less, 21 μm or more and 180 μm or less, 25 μm or more and 180 μm or less, 30 μm or more and 180 μm or less, 10 μm or more and 150 μm or less, 15 μm or more and 150 μm or less, 21 μm or more and 150 μm or less, 25 μm or more and 150 μm or less, 30 μm or more and 150 μm or less, 10 μm or more and 100 μm or less, 15 μm or more and 100 μm or less, 21 μm or more and 100 μm or less, 25 μm or more and 100 μm or less, 30 μm or more and 100 μm or less, 10 μm or more and 80 μm or less, 15 μm or more and 80 μm or less, 21 μm or more and 80 μm or less, 25 μm or more and 80 μm or less, 30 μm or more and 80 μm or less, 10 μm or more and 60 μm or less, 15 μm or more and 60 μm or less, 21 μm or more and 60 μm or less, 25 μm or more and 60 μm or less, 30 μm or more and 60 μm or less, 10 μm or more and 50 μm or less, 15 μm or more and 50 μm or less, 21 μm or more and 50 μm or less, 25 μm or more and 50 μm or less, or 30 μm or more and 50 μm or less.

The plastic film has a JIS K7136:2000 haze of preferably 3.0% or less, more preferably 2.0% or less, still more preferably 1.5% or less, and still more preferably 1.0% or less.

The plastic film has a JIS K7361-1:1997 total light transmittance of preferably 80% or more, more preferably 85% or more, and still more preferably 90% or more.

<Erosion Rate>

The plastic film preferably have an $E_{0\text{-}20}$ of 1.4 μm/g or more when $E_{0\text{-}20}$ is defined as the average erosion rate from the surface of the plastic film to a depth of 20 μm.

As used herein, $E_{0\text{-}20}$ is measured under the following measurement conditions.

<Measurement Conditions>

A test solution is prepared by mixing pure water, dispersion, and spherical silica with an average particle size within ±8% of 4.2 μm as a reference at a mass ratio of 968:2:30, and is then put into a container. The test solution in the container is fed to a nozzle. Compressed air is fed into the nozzle to accelerate the test solution within the nozzle, and a predetermined amount of the test solution is jetted perpendicularly onto a first surface of the plastic film through a jet hole at the tip of the nozzle. This causes the spherical silica in the test solution to collide with the plastic film. The cross-sectional shape of the nozzle is 1 mm×1 mm square, and the distance between the jet hole and the plastic film is 4 mm. Meanwhile, the flow rate of the test liquid or the compressed air supplied to the nozzle, the pressure of the compressed air, and the pressure of the test liquid in the nozzle should be predetermined values adjusted by the calibration described below.

After a predetermined amount of the test solution is jetted, the jetting of the test solution is temporarily stopped.

After the jetting of the test solution is temporarily stopped, the cross-sectional profile of the plastic film where the spherical silica particles in the test solution have collided is measured.

One cycle consists of three steps including: a step of jetting a predetermined amount of the test solution from the jet hole; a step of temporarily stopping the jetting of the test solution after the predetermined amount of the test solution is jetted; and a step of measuring the cross-sectional profile after the jetting of the test solution is temporarily stopped. The cycle is repeated until the depth of the cross-sectional profile exceeds 20 μm. The erosion rate (μm/g) of the plastic film for each cycle until the depth of the cross-sectional profile reaches 20 μm is calculated. The erosion rate of the plastic film for each cycle until the depth of the cross-sectional profile reaches 20 μm is averaged to calculate the above $E_{0-20}$.

<Calibration>

The test solution is put into the container. The test solution in the container is fed to the nozzle. Compressed air is fed into the nozzle to accelerate the test solution within the nozzle, and an arbitrary amount of the test solution is jetted perpendicularly onto an acrylic plate with a thickness of 2 mm through a jet hole at the tip of the nozzle. This causes the spherical silica in the test solution to collide with the acrylic plate. The cross-sectional shape of the nozzle is 1 mm×1 mm square, and the distance between the jet hole and the acrylic plate is 4 mm.

After an arbitrary amount of the test solution is jetted, the jetting of the test solution is temporarily stopped. After the jetting of the test solution is temporarily stopped, the cross-sectional profile of the acrylic plate where the spherical silica particles in the test solution have collided is measured.

The erosion rate (μm/g) of the acrylic plate is calculated by dividing the depth (μm) of the cross-sectional profile by the arbitrary amount (g).

If the erosion rate of the acrylic plate is within ±5% of 1.88 (μm/g) as a reference, the test is passed. Meanwhile, the flow rate of the test liquid or the compressed air, the pressure of the compressed air, and the pressure of the test liquid in the nozzle should be adjusted and calibrated so that the erosion rate of the acrylic plate is within the range.

Hereinafter, the measurement conditions of the erosion rate and the technical significance of the erosion rate calculated using the measurement conditions are explained with reference to FIG. 7. For example, an instrument for measuring the erosion rate as shown in FIG. 7 is an MSE testing instrument, product number "MSE-A203", of Palmeso Co., Ltd.

The erosion rate of the present disclosure is measured under the following conditions. First, a test solution is prepared by mixing pure water, a dispersant, and spherical silica with an average particle size within 4.2 μm±8% as a reference at a mass ratio of 968:2:30, and is then put into a container (11). In the container (11), the test solution preferably be stirred.

The dispersant is not particularly limited as long as the spherical silica can be dispersed. Examples of the dispersant include the product name "DEMOL N" from Wako Pure Chemical Industries, Ltd.

In other words, the wording "average particle size within 4.2 μm±8% as a reference" means that the average particle size is 3.864 μm or more and 4.536 μm or less.

Meanwhile, in the measurement conditions of erosion rate herein, the "average particle size of spherical silica" is measured as the volume-averaged value d50 in the particle size distribution measurement by laser light diffractometry (so-called "median diameter").

In the results of measuring the particle size distribution of the spherical silica, the maximum frequency of the particle size is normalized to 100. Preferably, at that time, the range of particle size with a frequency of 50 is within ±10% of 4.2 μm as a reference. The phrase "range of particle size with a frequency of 50" is expressed as "X–Y (μm)" while "X" is defined as the particle size that has a frequency of 50 and is positioned in a more plus direction than the particle size with a frequency of 100 and "Y" is defined as the particle size that has a frequency of 50 and is positioned in a more minus direction than the particle size with a frequency of 100. Note that as used herein, the "range of particle size with a frequency of 50" is sometimes referred to as the "full width at half height of the particle size distribution".

Examples of the spherical silica with an average particle size within ±8% of 4.2 μm as a reference is model number "MSE-BS-5-3" designated by Palmeso Co., Ltd. Examples of the spherical silica corresponding the model number "MSE-BS-5-3" designated by Palmeso Co., Ltd. include the product number "BS5-3" of Potters-Ballotini Co., Ltd.

The test solution in the container is fed into a nozzle (51). The test solution may, for example, be sent to the nozzle through piping (21) for the test solution. Between the container (11) and the nozzle (51), a flow meter (31) for measuring the flow rate of the test solution is preferably disposed. The flow rate of the test solution should be a value adjusted by the above-mentioned calibration.

Note that in FIG. 7, the nozzle (51) is located inside a housing (52) that constitutes a jetting section (50).

Compressed air is fed into the nozzle (51). The compressed air is delivered to the nozzle, for example, through a compressed air line (22). The position in the nozzle where the compressed air is fed preferably be upstream of the position where the test solution is fed. The upstream side is the side far from the nozzle's jet hole.

A flow meter (32) for measuring the flow rate of the compressed air and a pressure gauge (42) for measuring the pressure of the compressed air are preferably installed, before the compressed air arrives at the nozzle (51). The compressed air may be supplied using, for instance, an air compressor (not shown).

The flow rate and the pressure of the compressed air should each be a value adjusted by the above-mentioned calibration.

When compressed air is delivered into the nozzle (51), the test solution is accelerated while being mixed by the compressed air. The accelerated test solution is then jetted through the jet hole at the tip of the nozzle (51) and impacts perpendicularly against a plastic film (70). The plastic film is mainly abraded by spherical silica particles in the test solution.

Note that the inside of the nozzle (51) is preferably provided with a pressure gauge (41) for measuring the pressure of the test solution in the nozzle. The pressure gauge (41) is preferably provided downstream of the position where the compressed air is fed and the position where the test solution is fed.

The pressure of the test solution in the nozzle (51) should be a value adjusted by the above-mentioned calibration.

The test solution jetted through the jet hole at the tip of the nozzle (51) is mixed with air and then sprayed. This can lower the impact pressure of spherical silica particles on the plastic film. Thus, the amount of abrasion of the plastic film by one spherical silica particle can be reduced to a small amount. FIG. 8 is a diagram that depicts the state of abrasion of the plastic film (70) by using a test solution containing pure water (A1) and spherical silica (A2) as jetted from the jetting section (50). In FIG. 8, reference sign A3 denotes air and reference sign A4 denotes a abraded plastic film.

In addition, the test solution contains water, which has an excellent cooling effect. This can practically eliminate deformation and degeneration of the plastic film as caused by heat at the time of impact. In other words, abnormal abrasion of the plastic film can be substantially eliminated. In addition, the water also plays a role in cleaning the abraded plastic film surface and achieving stable abrasion. Further, the water also plays a role in accelerating the spherical silica particles and controlling how the test solution flows.

Furthermore, since a huge number of spherical silica particles collide with the plastic film, the influence of subtle differences in physical properties of individual spherical silica particles can be eliminated.

Moreover, for the measurement conditions in the present disclosure, the flow rate of the test liquid supplied to the nozzle, the flow rate of the compressed air supplied to the nozzle, the pressure of the compressed air supplied to the nozzle, and the pressure of the test liquid in the nozzle are set to values adjusted by the calibration, the cross-sectional shape of the nozzle is set to a square of 1 mm×1 mm, and the distance between the jet hole and the plastic film is set to 4 mm to identify elements having an influence on the amount of abrasion of the plastic film. Note that the distance is denoted by "d" in FIG. 7, and means the vertical distance between the nozzle tip, namely the jet hole, and the plastic film.

From the above, it can be said that the measurement conditions of the present disclosure are those that enable the formation of statistically stable abrasion marks on the plastic film.

The plastic film (70) may be attached to a sample mount (81) of a measuring device (100). It is preferable to mount the plastic film (70) on the sample mount (81) via a support (82) such as a stainless steel plate.

The test solution jetted onto the plastic film (70) preferably be collected in a receptor (12) and returned to the container (11) through return piping (23). A return pump (24) is preferably disposed between the receptor (12) and the return piping (23).

The measurement conditions of the present disclosure require that the jetting of the test solution is temporarily stopped after the jetting of a predetermined amount of the test solution, and that the cross-sectional profile of the plastic film where the spherical silica particles in the test solution collide is measured after the jetting of the test solution is temporarily stopped.

The cross-sectional profile means the cross-sectional shape of the plastic film abraded by the test solution. The plastic film is mainly abraded by spherical silica particles in the test solution.

The cross-sectional profile may be measured by the cross-sectional profile acquisition unit (60) such as a stylus-type surface profilometer or a laser interferometry-type surface profilometer. Note that the cross-sectional profile acquisition unit (60) is usually located at a position away from the plastic film (70) when the test solution is jetted. For this reason, it is preferable that at least one of the plastic film (70) or the cross-sectional profile acquisition unit (60) is movable.

Palmeso Co., Ltd.'s MSE tester, product number "MSE-A203", uses a stylus method for measuring a cross-sectional profile.

Further, under the measurement conditions of the present disclosure, one cycle consists of three steps: a step of jetting a predetermined amount of test solution from the jet hole; a step of temporarily stopping the jetting of the test solution after the predetermined amount of the test solution is jetted; and a step of measuring a cross-sectional profile after the jetting of the test solution is temporarily stopped. The cycle is repeated until the depth of the cross-sectional profile exceeds 20 µm.

This operation is executed to measure the erosion rate of the plastic film at each cycle, and further calculate how much the erosion rate of the plastic varies.

The above cycle may be continued after the depth of the cross-sectional profile exceeds 20 µm, but it is preferable to terminate the cycle when the depth of the cross-sectional profile exceeds 20 µm. Meanwhile, the reason why the measurement is limited to the "depth of 20 µm from the surface of the plastic film" is that the physical properties of the plastic film tend to fluctuate at or near the surface, while they tend to be more stable as the site gets into a deeper portion.

As used herein, the erosion rate at each cycle can be calculated by dividing the depth (µm) of cross-sectional profile having progressed at each cycle by the amount (g) of test solution jetted in each cycle. The depth (µm) of cross-sectional profile at each cycle is the depth at the deepest position of cross-sectional profile at each cycle.

The amount of the test solution jetted in each cycle is, in principle, a fixed quantity, but it may vary slightly in each cycle.

The amount of the test solution jetted in each cycle is not particularly limited, but the lower limit is preferably 0.5 g or larger and more preferably 1.0 g or larger, and the upper limit is preferably 3.0 g or less and more preferably 2.0 g or less.

Under the measurement conditions of the present disclosure, the erosion rate (µm/g) is calculated for each cycle until the depth of the cross-sectional profile reaches 20 µm. The erosion rate at each cycle until the depth of the cross-sectional profile reaches 20 µm is then averaged to calculate $E_{0-20}$.

This cycle is repeated until the depth of the cross-sectional profile exceeds 20 µm. Here, the data obtained at the cycle with a cross-sectional profile depth of more than 20 µm is excluded from the date for calculating $E_{0-20}$.

In general, the softer the plastic film is, the easier it is to scratch, and the harder the film is, the harder it is to scratch. The present inventors considered using, as an index of pencil hardness, the values obtained from evaluations using a picodentor in the depth direction (e.g., Martens hardness, indentation hardness, elastic recovery work). Unfortunately, the above-described parameters such as Martens hardness, indentation hardness, and elastic recovery work were sometimes unable to be used as an index of pencil hardness.

In addition, the plastic film when stretched tends to have increased strength. Specifically, uniaxially stretched plastic films tend to have better pencil hardness than unstretched plastic films; and biaxially stretched plastic films tend to have better pencil hardness than the uniaxially stretched plastic films. However, there were cases where pencil hardness was not sufficient even for the biaxially stretched plastic films.

The present inventors then examined the erosion rate as an index of pencil hardness of the plastic film. As mentioned above, plastic films are more easily scratched if they are soft and less easily scratched if they are hard. Therefore, it is considered that a smaller erosion rate can improve the pencil hardness. However, the present inventors have, instead, found that by increasing the erosion rate ($E_{0-20}$) to 1.4 μm/g or more, the plastic film can have favorable pencil hardness. The present inventors have also found that the erosion rate of the plastic film tends to be larger for biaxially stretched plastic films than for uniaxially stretched plastic films, and that the erosion rate can be used to determine whether the pencil hardness of biaxially stretched plastic film is favorable or not.

The reason why the erosion rate of the plastic film correlates with pencil hardness may be as follows.

As described above, under the measurement conditions of the present disclosure, the test solution containing water and spherical silica is mixed with air and jetted. This can lower the impact pressure of spherical silica particles on the plastic film. Accordingly, in the case of a soft plastic film, the stresses caused by the spherical silica colliding with the plastic film are easily dispersed. This seems to cause the plastic film to be less prone to abrasion, resulting in a low erosion rate. By contrast, in the case of a hard plastic film, the stresses caused by the spherical silica colliding with the plastic film are not easily dispersed. This seems to cause the plastic film to be more prone to abrasion, resulting in a high erosion rate.

Biaxially stretched plastic films have different erosion rates. This seems to be caused by the difference in the degree of elongation of molecular chains and the difference in the degree of molecular orientation. For example, in biaxially stretched plastic films, the molecules are, in principle, stretched in-plane. However, there may be some molecules that are not sufficiently stretched locally in the plane. Thus, it is expected that the biaxially stretched plastic film becomes locally softer and the erosion rate decreases as the percentage of molecules that are not sufficiently stretched locally in the plane increases.

In addition, even biaxially stretched plastic films with comparable in-plane phase differences are considered to exhibit different erosion rates due to differences in local molecular orientation. Conversely, even biaxially stretched plastic films with equivalent erosion rate values may exhibit different in-plane phase differences due to differences in the proportion between the stretching ratio in the flow direction and the stretching ratio in the width direction.

The $E_{0-20}$ is preferably 1.4 μm/g or more, more preferably 1.6 μm/g or more, still more preferably 1.8 μm/g or more, still more preferably 1.9 μm/g or more, and still more preferably 2.0 μm/g or more in order to obtain favorable pencil hardness.

As described above, it is expected that the erosion rate decreases as the percentage of molecules that are not sufficiently stretched locally in the plane increases. In other words, a higher erosion rate is expected to result in a smaller fraction of molecules that are not sufficiently extended locally in the plane. Therefore, by setting the $E_{0-20}$ to 1.4 μm/g or higher, it is easy to suppress wrinkling of plastic films under a high temperature environment.

The $E_{0-20}$ is preferably 3.0 μm/g or less, more preferably 2.5 μm/g or less, and still more preferably 2.2 μm/g or less in order to make the plastic film less susceptible to cracking.

If the values of $E_{0-20}$ are the same but the in-plane phase differences, for instance, are different, the properties of plastic film may vary. For example, if the values of $E_{0-20}$ are the same and the in-plane phase difference exceeds 1450 nm, the plastic film may remain bent or may break when the plastic film is folded.

In addition, the plastic film with an $E_{0-20}$ of less than 1.4 μm/g has insufficient hardness of the plastic film even if a cured film with a high hardness is formed on the plastic film. Thus, the pencil hardness of the cured film is not necessarily favorable.

Examples of the embodiment of a preferable numerical range of $E_{0-20}$ include 1.4 μm/g or more and 3.0 μm/g or less, 1.4 μm/g or more and 2.5 μm/g or less, 1.4 μm/g or more and 2.2 μm/g or less, 1.5 μm/g or more and 3.0 μm/g or less, 1.5 μm/g or more and 2.5 μm/g or less, 1.5 μm/g or more and 2.2 μm/g or less, 1.6 μm/g or more and 3.0 μm/g or less, 1.6 μm/g or more and 2.5 μm/g or less, 1.6 μm/g or more and 2.2 μm/g or less, 1.8 μm/g or more and 3.0 μm/g or less, 1.8 μm/g or more and 2.5 μm/g or less, 1.8 μm/g or more and 2.2 μm/g or less, 1.9 μm/g or more and 3.0 μm/g or less, 1.9 μm/g or more and 2.5 μm/g or less, 1.9 μm/g or more and 2.2 μm/g or less, 2.0 μm/g or more and 3.0 μm/g or less, 2.0 μm/g or more and 2.5 μm/g or less, or 2.0 μm/g or more and 2.2 μm/g or less The plastic film has two flat surfaces, a front surface and a back surface. In the plastic film, both $E_{0-20}$, measured from one flat surface side, and $E_{0-20}$, measured from the other flat surface side, are preferably the above-described values. For regular plastic films, the erosion rate measured from one flat surface side and the erosion rate measured from the other flat surface side are approximately the same.

Before the erosion rate described above is measured, the above-described calibration should be performed.

For example, the calibration can be conducted as follows.
<Calibration>

The test solution is put into the container. The test solution in the container is fed to the nozzle. Compressed air is fed into the nozzle to accelerate the test solution within the nozzle, and an arbitrary amount of the test solution is jetted perpendicularly onto an acrylic plate with a thickness of 2 mm through a jet hole at the tip of the nozzle. This causes the spherical silica in the test solution to collide with the acrylic plate. The cross-sectional shape of the nozzle is 1 mm×1 mm square, and the distance between the jet hole and the acrylic plate is 4 mm.

After an arbitrary amount of the test solution is jetted, the jetting of the test solution is temporarily stopped. After the jetting of the test solution is temporarily stopped, the cross-sectional profile of the acrylic plate where the spherical silica particles in the test solution have collided is measured.

The erosion rate (μm/g) of the acrylic plate is calculated by dividing the depth (μm) of the cross-sectional profile by the arbitrary amount (g).

If the erosion rate of the acrylic plate is within ±5% of 1.88 (μm/g) as a reference, the test is passed. Meanwhile, the flow rate of the test liquid or the compressed air, the pressure of the compressed air, and the pressure of the test liquid in the nozzle should be adjusted and calibrated so that the erosion rate of the acrylic plate is within the range.

The test solution used in the calibration should be the same as the test solution used in the measurement conditions to be implemented later.

The measuring device used in the calibration should be the same as the measuring device used in the measurement conditions to be implemented later.

The difference between the calibration and the measurement conditions to be implemented later is, for example, the use of a 2 mm-thick acrylic plate as a standard sample in the calibration, whereas a plastic film is used as a sample in the measurement conditions.

The standard sample, an acrylic plate of 2-mm thickness, is preferably a polymethyl methacrylate plate (PMMA plate). The acrylic sheet with a thickness of 2 mm as a standard sample preferably has an AcE of 1.786 μm/g or more and 1.974 μm/g or less, when AcE is defined as the average erosion rate of acrylic sheet measured under the following measurement conditions A. Here, examples of the spherical silica under the following measurement conditions A is model number "MSE-BS-5-3" designated by Palmeso Co., Ltd. Examples of the spherical silica corresponding the model number "MSE-BS-5-3" designated by Palmeso Co., Ltd. include the product number "BS5-3" of Potters-Ballotini Co., Ltd.

<Measurement Conditions A>

A test solution is prepared by mixing pure water, a dispersant, and spherical silica with an average particle size within ±8% of 4.2 μm at a mass ratio of 968:2:30, and is then put into a container. The test solution in the container is fed to a nozzle. Compressed air is fed into the nozzle to accelerate the test solution within the nozzle, and a predetermined amount of the test solution is jetted perpendicularly onto the acrylic plate through a jet hole at the tip of the nozzle. This causes the spherical silica in the test solution to collide with the acrylic plate. The cross-sectional shape of the nozzle is 1 mm×1 mm square, and the distance between the jet hole and the acrylic plate is 4 mm. Meanwhile, the flow rate of the test liquid or the compressed air supplied to the nozzle, the pressure of the compressed air, and the pressure of the test liquid in the nozzle is provided such that the flow rate of the test liquid is 100 ml/min or more and 150 ml/min or less, the flow rate of the compressed air is 4.96 L/min or more and 7.44 L/min or less, the pressure of the compressed air is 0.184 MPa or more and 0.277 MPa or less, and the pressure of the test liquid in the nozzle is 0.169 MPa or more and 0.254 MPa or less.

After 4 g of the test solution is jetted, the jetting of the test solution is temporarily stopped.

After the jetting of the test solution is temporarily stopped, the cross-sectional profile of the acrylic plate where the spherical silica particles in the test solution have collided is measured.

The erosion rate AcE (represented in "μm/g") of the acrylic plate is calculated by dividing the depth (μm) of the cross-sectional profile by the amount (4 g) of the test solution jetted.

If the erosion rate of the acrylic plate during calibration falls within 1.88 (μm/g)±5% as a reference, the test is passed. Meanwhile, the flow rates of the test liquid and the compressed air, the pressure of the compressed air, and the pressure of the test liquid in the nozzle should be adjusted for implementation so that the erosion rate of the acrylic plate falls within the range.

The erosion rate of 1.88 (μm/g)±5% as a reference" means, in other words, that the erosion rate is from 1.786 (μm/g) or more and 1.974 (μm/g) or less.

<$\sigma_{0-20}/E_{0-20}$>

In the plastic film, $\sigma_{0-20}$ is defined as the variation of erosion rate as calculated from the rates of erosion from the surface of the plastic film to the depth of 20 μm. At that time, $\sigma_{0-20}/E_{0-20}$ preferably be 0.100 or less.

As used herein, $\sigma_{0-20}$ can be calculated from the erosion rate for each cycle until the depth of the cross-sectional profile reaches 20 μm under the above measurement conditions.

Here, $\sigma_{0-20}/E_{0-20}$ indicates the coefficient of variation of the erosion rate, and a small value of $\sigma_{0-20}/E_{0-20}$ means that the erosion rate is less likely to vary in the thickness direction of the plastic film. By setting $\sigma_{0-20}/E_{0-20}$ to 0.100 or less, the erosion rate in the thickness direction is stabilized and better pencil hardness can be easily obtained.

The upper limit of $\sigma_{0-20}/E_{0-20}$ is more preferably 0.080 or less, still more preferably 0.070 or less, still more preferably 0.060 or less, and still more preferably 0.055 or less.

The lower limit of $\sigma_{0-20}/E_{0-20}$ is not particularly limited, and is usually greater than 0, preferably 0.020 or greater, and more preferably 0.035 or greater. In addition, the plastic film may be weakly stretched when the value of $\sigma_{0-20}/E_{0-20}$ is low. Weakly stretched plastic films tend to have poor solvent resistance, be easily broken, and have low stability against heat and humidity. Thus, $\sigma_{0-20}/E_{0-20}$ preferably be 0.020 or greater.

Examples of the embodiment of the preferable numerical range of $\sigma_{0-20}/E_{0-20}$ include more than 0 and 0.100 or less, more than 0 and 0.080 or less, more than 0 and 0.070 or less, more than 0 and 0.060 or less, more than 0 and 0.055 or less, 0.020 or more and 0.100 or less, 0.020 or more and 0.080 or less, 0.020 or more and 0.070 or less, 0.020 or more and 0.060 or less, 0.020 or more and 0.055 or less, 0.035 or more and 0.100 or less, 0.035 or more and 0.080 or less, 0.035 or more and 0.070 or less, 0.035 or more and 0.060 or less, or 0.035 or more and 0.055 or less.

The plastic film has two flat surfaces, a front surface and a back surface. In the plastic film, both $\sigma_{0-20}/E_{0-20}$, measured from one flat surface side, and $\sigma_{0-20}/E_{0-20}$, measured from the other flat surface side, are preferably the above-described values.

The pencil hardness of the plastic film is preferably HB or higher and more preferably F or higher.

If the pencil hardness of the plastic film is too high, the in-plane phase difference of the plastic film tends to increase. For this reason, the pencil hardness of the plastic film is preferably 2H or less.

As used herein, the pencil hardness is measured and determined by the following operations (1) to (6):

(1) prepare a sample by cutting a plastic film to a size of 5 cm×10 cm;
(2) heat the plastic film at 100° C. for 10 minutes, and after heating, allow the plastic film to stand in an environment at 24° C. and a relative humidity of 40% RH or more and 60% RH or less for 30 minutes to 60 minutes;
(3) measure the pencil hardness of the plastic film in accordance with scratching hardness (pencil method) in JIS K 5600-5-4:1999 (specifically, a pencil with a given hardness is placed at an angle of 45 degrees onto a surface of the plastic film and moved at a speed of 3.0 mm/sec under a load of 100 g, so that the load is applied to the plastic film);
(4) applying the load to the plastic film, and then re-heat the sample at 100° C. for 10 minutes;
(5) immediately after re-heating, visually evaluate scratches on the plastic film while the environment for visual evaluation is set to 24° C. and a relative humidity of 40% RH or more and 60% RH or less; and
(6) repeat operations (1) through (5) above five times. Of pencils that give no scratches 4 times out of 5 times, the hardest one is defined as the pencil hardness of the plastic film being evaluated.

In the above method of measuring and determining pencil hardness, the case where there are no scratches 4 times out of 5 times at hardness B and 3 times out of 5 times at hardness F is determined as hardness B.

If the plastic film has a slow axis and a fast axis, the pencil hardness preferably be B or higher in both the slow-axis and the fast-axis directions. The slow axis of a plastic film is the direction with the highest refractive index in the plane of the plastic film. The fast axis of a plastic film is a direction perpendicular to the slow axis in the plane of the plastic film.

Examples of the lamination structure of the plastic film include a monolayer structure or a multilayer structure. Of these, a monolayer structure is preferable.

The plastic film preferably be a biaxially stretched plastic film with a small in-plane phase difference to suppress rainbow unevenness while maintaining favorable mechanical strength. In order to reduce the in-plane phase difference of a stretched plastic film, the stretching in the flow direction and the stretching in the width direction are preferably made closer to be equal. In addition, in order to keep the erosion rate of plastic film within the above range, it is preferable to stretch the molecules evenly within the plane of the plastic film. Therefore, in order to keep the average in-plane phase difference and the average erosion rate of the plastic film within the above mentioned ranges, it is important to control the stretching. For stretching control, fine stretching control is difficult in a multilayer structure due to differences in physical properties of each layer, whereas fine stretching control is easy in a single-layer structure, which is preferable.

<<Production Examples of Plastic Film>>

The following describes a plastic film production example as a representative example of a biaxially stretched plastic film.

The biaxially stretched plastic film can be obtained by stretching a resin layer containing the components constituting the plastic film. Examples of the stretching technique include sequential biaxial stretching and simultaneous biaxial stretching.

—Sequential Biaxial Stretching—

In sequential biaxial stretching, a casting film is stretched in the flow direction, and then the film is stretched in the width direction.

The stretching in the flow direction is generally performed by the difference in peripheral speed of a pair of stretching rolls. The stretching in the flow direction may be performed in one step or may be performed in multiple steps using a plurality of stretching roll pairs. In order to suppress excessive variations in optical properties such as in-plane phase difference, it is preferable to bring a plurality of nip rolls close to the stretching rolls. The stretching ratio in the flow direction is generally twice or more and 15 times or less and is preferably twice or more and 7 times or less, more preferably 3 times or more and 5 times or less, further preferably 3 times or more and 4 times or less, in order to suppress excessive variations in optical properties such as in-plane phase difference.

The stretching temperature is preferably the glass transition temperature of the resin or more and the glass transition temperature+100° C. or less, in order to suppress excessive variations in optical properties such as in-plane phase difference. In the case of PET, 70° C. or more and 120° C. or less is preferable, 80° C. or more and 110° C. or less is more preferable, and 95° C. or more and 110° C. or less is further preferable. The stretching temperature means a temperature pre-set by the instrument. Even if the temperature pre-set by the instrument is set in the range mentioned above, it takes time for the temperature to stabilize. For this reason, it is preferable to produce a plastic film after the temperature is set to the above range and the temperature is then stabilized. The temperature pre-set by the instrument is herein described in several places. The same applies to the other pre-set temperatures, and it is preferable to produce a plastic film after the temperature is stabilized.

For the stretching temperature, the average of the in-plane phase difference tends to be small by reducing the stretching section at low temperature, for example, by rapidly raising the temperature of the film. Meanwhile, the temperature of the film may be slowly increased to make longer the section stretched at low temperatures. This leads to higher orientation, larger average in-plane phase difference, and smaller slow-phase axis variation.

It is preferable to use a heater that generates a turbulent flow during heating in stretching. A temperature difference occurs in a minute area in the plane of the film by heating with a wind containing a turbulent flow, and the temperature difference causes a minute shift in the orientation axis, thereby enabling the condition A to be easily satisfied. When the plastic film satisfies condition A, the $\Sigma_T$ of the optical film can be easily set to within the above range.

Also, in stretching in the flow direction, the erosion rate tends to decrease as the stretching time is shortened and to increase as the stretching time is extended. The reason for this is thought to be that a short stretching time makes it difficult for the molecules to be stretched evenly in the plane of the plastic film, while a long stretching time makes it easier for the molecules to be stretched evenly in the plane of the plastic film. In other words, to obtain $E_{0-20}$ of 1.4 µm/g or higher, it is preferable to increase the stretching time. Further, it is easier to achieve an $E_{0-20}$ of 1.4 µm/g or higher by increasing the stretching time while suitably increasing the stretching ratio to the extent that the physical properties do not vary.

The film stretched in the flow direction may be given functions such as better slippery, better adhesiveness, and antistatic properties by in-line coating or off-line coating. Also, surface treatment such as corona treatment, flame treatment, or plasma treatment may be optionally applied prior to the in-line coating or the off-line coating.

A layer(s) formed by in-line or off-line coating should not be counted as the number of layers constituting the plastic film.

The stretching in the width direction is generally performed with tentering by transporting the film while gripping both ends of the film with clips. The stretching ratio in the width direction is generally twice or more and 15 times or less and is preferably twice or more and 5 times or less more preferably 3 times or more and 5 times or less, further preferably 3 times or more and 4.5 times or less, in order to suppress excessive variations in optical properties such as in-plane phase difference. It is preferable to set the width stretching ratio to be higher than the longitudinal stretching ratio.

The stretching temperature is preferably the glass transition temperature of the resin or more and the glass transition temperature+110° C. or less and preferably increases from the upstream to the downstream. The stretching temperature means a temperature pre-set by the instrument. The upstream side is the side near the point where the stretching in the width direction starts. The downstream side is the side near the point where the stretching in the width direction ends. Specifically, when the transverse stretching section is divided into two parts in terms of length, the difference between the upstream and downstream temperatures is preferably 20° C. or more, more preferably 30° C. or more, still more preferably 35° C. or more, and still more preferably 40° C. or more. For PET, the stretching temperature at the first step is preferably 80° C. or more and 120° C. or less, more preferably 90° C. or more and 110° C. or less, and still more preferably 95° C. or more and 105° C. or less. The transverse stretching section may be divided into two parts and the stretching temperature at the first step and the stretching temperature at the second step may be set to different temperatures. This allows the surface temperature of the film during the first step of stretching and the surface temperature during the second step of stretching to be controlled at different temperatures. This can prevent excessive orientation and oriented crystallization at each stretching step, and can thus prevent the plastic film from becoming fragile. Therefore, pencil hardness can be easily improved.

The plastic film sequentially biaxially stretched as above is preferably subjected to heating in a tenter at the stretching temperature or higher and lower than the melting point, in order to provide flatness and dimensional stability. The heat treatment temperature means a temperature pre-set by the instrument. Specifically, in the case of PET, heat setting within the range of 140° C. or more and 240° C. or less is preferably performed, more preferably 200° C. or more and 250° C. or less. Additional stretching of 1% or more and 10% or less is preferably performed in the first half of the heating, in order to suppress excessive variations in optical properties such as in-plane phase difference.

After heating, the plastic film is slowly cooled to room temperature and then wound up. In heating and slowly cooling, relaxation treatment or the like may be used in combination, as required. The relaxation rate during heating is preferably 0.5% or more and 5% or less, more preferably 0.5% or more and 3% or less, further preferably 0.8% or more and 2.5% or less, even more preferably 1% or more and 2% or less, in order to suppress excessive variations in optical properties such as in-plane phase difference. The relaxation rate during slow cooling is preferably 0.5% or more and 3% or less, more preferably 0.5% or more and 2% or less, further preferably 0.5% or more and 1.5% or less, even more preferably 0.5% or more and 1.0% or less, in order to suppress excessive variations in optical properties such as in-plane phase difference. The temperature during slow cooling is preferably 80° C. or more and 140° C. or less, more preferably 90° C. or more and 130° C. or less, further preferably 100° C. or more and 130° C. or less, even more preferably 100° C. or more and 120° C. or less, in order to improve flatness. The temperature at the time of slow cooling means a temperature pre-set by the instrument.

—Simultaneous Biaxial Stretching—

In simultaneous biaxial stretching, a casting film is guided to a simultaneous biaxial tenter and transported while gripping both ends of the film with clips, so as to be stretched simultaneously and/or stepwise in the flow and width directions. Examples of the simultaneous biaxial stretching machine include pantagraph-type, screw-type, drive motor-type, and linear motor-type. A drive motor-type or linear motor-type machine is preferable since the stretching ratio can be changed arbitrarily, and the relaxation treatment can be performed at any place.

The magnification of simultaneous biaxial stretching is generally 6 times or more and 50 times or less in terms of area magnification. The area magnification is preferably 8 times or more and 30 times or less, more preferably 9 times or more and 25 times or less, further preferably 9 times or more and 20 times or less, even more preferably 10 times or more and 15 times or less, in order to suppress excessive variations in optical properties such as in-plane phase difference. In simultaneous biaxial stretching, the stretching ratio in the flow direction and the stretching ratio in the width direction are preferably adjusted within the range of twice or more and 15 times or less, so that the aforementioned area magnification is achieved.

In the case of simultaneous biaxial stretching, the stretching ratios in the flow and width directions are preferably almost the same, and the stretching speed in the flow and width directions are also preferably almost the same, in order to suppress the difference in orientation in the plane.

The stretching temperature in simultaneous biaxial stretching is preferably the glass transition temperature of the resin or more and the glass transition temperature+120° C. or less, in order to suppress excessive variations in optical properties such as in-plane phase difference. In the case of PET, the temperature is preferably 80° C. or more and 160° C. or less, more preferably 90° C. or more and 150° C. or less, further preferably 100° C. or more and 140° C. or less. The stretching temperature means a temperature pre-set by the instrument.

The film simultaneously biaxially stretched is preferably subjected to heating subsequently in a heat setting chamber of the tenter at the stretching temperature or higher and lower than the melting point, in order to provide flatness and dimensional stability. The heat treatment temperature means a temperature pre-set by the instrument. The heating conditions are the same as the heating conditions after sequential biaxial stretching.

<Low-Refractive Index Layer>

The low-refractive index layer has roles of enhancing the anti-reflection properties of the optical film and enabling rainbow unevenness when viewed with the naked eyes to be easily suppressed. The low-refractive index layer is preferably located on the surface on the low-refractive index layer side of the optical film with reference to the plastic film. A functional layer(s) such as an antifouling layer and an antistatic layer may be placed on the low-refractive index layer as long as the effects of the optical film of the present disclosure are not inhibited.

Although the light directed toward the viewer from the inside of the image display device is linearly polarized light when it passes through the polarizer, the polarization state of the linearly polarized light is disturbed after passing through the plastic film, to be light having P waves and S waves mixed. Then, there is a difference in reflectance between P waves and S waves, and the reflectance difference is dependent on the wavelength. Therefore, it is considered that rainbow unevenness is visible to the naked eyes. Here, in the case of having a low-refractive index layer on the plastic film, it is considered that the aforementioned reflectance difference can be decreased, thereby enabling rainbow unevenness to be easily suppressed.

However, as mentioned above, when the reflectance of the optical film with a low-refractive index layer may be lowered, it is difficult to obtain favorable color tone uniformity when viewed at an oblique angle. This seems to be because of the interference of light reflected on the optical film with a low-refractive index layer.

Accordingly, when the average refractive index of the low-refractive index layer is defined as n1 and the average refractive index of a layer adjacent to the low-refractive index layer is defined as n2, n2/n1 is preferably less than 1.23. The n2/n1 is set to less than 1.23. This can prevent the interference of reflected light and facilitate favorable color tone uniformity when viewed at an oblique angle.

The n2/n1 is more preferably 1.20 or less, still more preferably 1.15 or less, and still more preferably 1.13 or less. In particular, by setting the n2/n1 to 1.05 or more and 1.15 or less, the wavelength dependence of reflectance can be easily suppressed. In addition, by setting the n2/n1 to 1.05 or more and 1.15 or less, the low-refractive index layer can be prevented from becoming fragile.

If the n2/n1 is made too small, the visual reflectance Y value of the optical film tends to be high. Thus, the n2/n1 is preferably 1.05 or more and more preferably 1.07 or more.

Examples of the preferable range of n2/n1 include 1.05 or more and less than 1.23, 1.05 or more and 1.20 or less, 1.05 or more and 1.15 or less, 1.05 or more and 1.13 or less, 1.07 or more and less than 1.23, 1.07 or more and 1.20 or less, 1.07 or more and 1.15 or less, or 1.07 or more and 1.13 or less.

To make it easier to keep the n2/n1 in the above range, the value of n2 is preferable to be low. For this purpose, the layer adjacent to the low-refractive index layer is preferably a plastic film or a hard coating layer, and more preferably a hard coating layer.

The average refractive index of each layer can be measured or calculated by the following method, for example, after specifying whether the thickness of each layer is more than 780 nm or 780 nm or less from a cross-sectional photograph of the laminate.

—Average Refractive Index of Layer with Thickness of More than 780 nm—

For the average refractive index of a layer with a thickness of more than 780 nm, the refractive index of the binder component of the layer is regarded as the refractive index of the layer. The average refractive index of a layer with a thickness of more than 780 nm can be calculated, for example, by the following Becke's method. The refractive index of the plastic film, the hard coating layer, or the anti-glare layer is preferably calculated by the Becke's method.

<<Becke's Method>>

The refractive index is calculated using the Becke's method according to JIS K7142:2008, method B (for transparent materials in powder or granular form), by shaving off the layer to be measured with, for instance, a cutter and by preparing a sample with the binder component in powder form.

—Average Refractive Index of Layer with Thickness of 780 nm or Less—

It is difficult to collect the binder component from the layer with a thickness of 780 nm or less. For this reason, the average refractive index of the layer with a thickness of 780 nm or less can be calculated using the following procedures (Y1) and (Y2), for example, by preparing a laminate 1 having a layer with a thickness of 780 nm or less. The refractive index n1 of the low-refractive index layer is preferably calculated using the procedures (Y1) and (Y2) below.

(Y1) Use the above Becke's method to calculate the average refractive index of a layer with a thickness of more than 780 nm among layers included in the laminate 1. Further, calculate, from a cross-sectional photograph of the laminate, the thickness of the layer with a thickness of more than 780 nm as well as the thickness of a layer with a thickness of 780 nm or less.

(Y2) Use information about the average refractive index of the layer with a thickness of more than 780 nm and its thickness and information about the thicknesses of the layer with a thickness of 780 nm or less as calculated in (Y1) above to calculate the average refractive index of the layer with a thickness of 780 nm or less by the fitting method below. The average refractive index n1 of the low-refractive index layer preferably falls within the range described below.

<<Fitting Method>>

The fitting method is a method to calculate the refractive index by fitting the reflection spectrum measured by a reflectometer with the reflection spectrum calculated from an optical model of a multilayer thin film using the Fresnel coefficient.

The average refractive index n2 of a layer adjacent to the low-refractive index layer is preferably greater than the average refractive index n1 of the low-refractive index layer. The n2 range is preferably set such that the n1 is set to the below-described range and the n2/n1 satisfies the above-described range. The n2 is preferably 1.42 or more and 1.60 or less and more preferably 1.45 or more and 1.58 or less.

The refractive index of the low-refractive index layer is preferably 1.45 or less, more preferably 1.43 or less, and still more preferably 1.40 or less from the viewpoint of suppressing rainbow unevenness.

If the refractive index of the low-refractive index layer is too low, the value of $\Sigma_T$ of the optical film tends to be less likely to meet the above range. For this reason, the refractive index of the low-refractive index layer is preferably 1.30 or more, more preferably 1.33 or more, and still more preferably 1.35 or more.

The thickness of the low-refractive index layer is preferably 60 nm or more and 200 nm or less, more preferably 80 nm or more and 120 nm or less, still more preferably 85 nm or more and 110 nm or less, and still more preferably 90 nm or more and 105 nm or less. The thickness of the low-refractive index layer is preferably larger than the average particle size of low-refractive index particles such as hollow particles.

The techniques for forming low-refractive index layers can be roughly classified into the wet methods and the dry methods. Examples of the wet methods include a formation technique by a sol-gel method using a metal alkoxide and the like, a formation technique by applying a resin having a low refractive index such as a fluorocarbon polymer, a formation technique by applying a coating solution for forming low-refractive index layers including a resin composition and low-refractive index particles. Examples of the dry methods include a formation technique of selecting particles having a desired refractive index out of the later-described low-refractive index particles and forming the low-refractive index layer by physical vapor deposition or chemical vapor deposition.

The wet methods are superior to the dry methods in production efficiency, suppression of diagonally reflected hue, and chemical resistance. Among the examples of the wet methods, it is preferable to form the low-refractive index layer by the coating solution for forming low-refractive index layers including a binder resin composition and low-refractive index particles, for adhesion, water resistance, scratch resistance, and low refractive index.

Examples of the low-refractive index particles include hollow and non-hollow particles. The low-refractive index particles may contain only either hollow or non-hollow particles, but it is preferable to include both hollow and non-hollow particles. Inclusion of both hollow and non-hollow particles makes it easier to suitably lower the refractive index of the low-refractive index layer while preventing a decrease in coating film strength. On the other hand, when only hollow particles are included, the refractive index of the-low-refractive index layer decreases excessively and the $\Sigma_T$ of the optical film is unlikely to meet the above range.

The materials of the hollow particles and the non-hollow particles may be any of an inorganic compound such as silica and magnesium fluoride and an organic compound but are preferably silica for low refractive index and strength. Hereinafter, hollow silica particles and non-hollow silica particles will be mainly described.

The hollow silica particles refer to particles each having an outer shell layer made of silica, with the inside of the particle surrounded by the outer shell layer being a cavity and the inside of the cavity containing air. The hollow silica particles are particles having a refractive index decreasing in proportion to the gas occupancy as compared with the original refractive index of silica by containing air. The non-hollow silica particles are particles the inside of which is not hollow like hollow silica particles. The non-hollow silica particles are, for example, solid silica particles.

The shapes of the hollow silica particles and the non-hollow silica particles are not specifically limited and may be a true sphere, a spheroid, or a substantially spherical shape such as a polyhedral shape that can be approximated to a sphere. Among these, a true sphere, a spheroid, or a substantially spherical shape is preferable, in consideration of the scratch resistance.

The hollow silica particles contain air inside and thus play a role in decreasing the refractive index of the entire low-refractive index layer. Use of hollow silica particles with an increased proportion of air and a large particle size can decrease the refractive index of the low-refractive index layer more. Meanwhile, the hollow silica particles tend to have poor mechanical strength. In particular, use of hollow silica particles with an increased proportion of air and a large particle size tends to decrease the scratch resistance of the low-refractive index layer.

The non-hollow silica particles play a role of improving the scratch resistance of the low-refractive index layer by being dispersed in the binder resin.

Highly concentrated hollow and non-hollow silica particles should be included in a binder resin and dispersed homogenously in the resin in the film thickness direction. In order to achieve this, the hollow silica particles should be placed in close proximity to each other, and the average particle size of the hollow silica particles and the average particle size of the non-hollow silica particles should be each set to within a predetermined range. Here, it is important to allow the non-hollow particles to be interposed between the hollow silica particles. The ratio of the average particle size of the non-hollow silica particles to the average particle size of the hollow silica particles (average particle size of non-hollow silica particles/average particle size of hollow silica particles) is preferably 0.29 or less, more preferably 0.27 or less. The ratio of the average particle size is preferably 0.05 or more, more preferably 0.10 or more.

The average particle size of hollow silica particles is preferably smaller than the thickness of the low-refractive index layer, and is, for example, 1 nm or more and 150 nm or less. The average particle size of hollow silica particles is preferably 35 nm or more and 100 nm or less, more preferably 50 nm or more and 100 nm or less, and still more preferably 60 nm or more and 80 nm or less.

The average particle size of non-hollow silica particles is preferably smaller than the thickness of the low-refractive index layer, and is, for example, 0.5 nm or more and 100 nm or less. The average particle size of non-hollow silica particles is preferably 1 nm or more and 30 nm or less, more preferably 5 nm or more and 20 nm or less, and still more preferably 10 nm or more and 15 nm or less.

The average particle size of low-refractive index particles may be calculated by the following operations (y1) to (y3).

(y1) Capture an image of a cross section of the low-refractive index layer by STEM. The acceleration voltage of the STEM is preferably set to 10 kV or more and 30 kV or less, and the magnification is preferably set to 50,000× or more and 300,000× or less.

(y2) Calculate the particle sizes of individual particles after randomly extracting 10 particles from the observed image. The particle size is measured as a linear distance in a combination of any two parallel straight lines sandwiching each particle in cross section in which the distance between the two straight lines is maximum. In the case where the particles are aggregated, the aggregated particles are regarded as one particle and measured.

(y3) After performing the same operation five times on different screen observation images of the same sample, define the value obtained from the number-averaged particle size for a total of 50 particles as the average particle size of the low-refractive index particles.

The surfaces of the hollow or non-hollow silica particles is preferably coated with a silane coupling agent. Examples of the silane coupling agent include general-purpose ones. Among them, preferred is a silane coupling agent with a (meth)acryloyl or epoxy group.

Applying a surface treatment to the silica particles with a silane coupling agent improves the affinity of the silica particles with the binder resin and makes it difficult for the silica particles to aggregate. Therefore, the dispersion of the silica particles tends to be uniform.

As the content of the hollow silica particles increases, the filling rate of the hollow silica particles in the binder resin increases, and the refractive index of the low-refractive index layer decreases. Therefore, the content of the hollow silica particles is preferably 100 parts by mass or more, more preferably 125 parts by mass or more, with respect to 100 parts by mass of the binder resin.

Meanwhile, when the content of the hollow silica particles is excessively large, the hollow silica particles tend to be easily damaged or drop out, so that the mechanical strength such as the scratch resistance of the low-refractive index layer tend to decrease. If the content of hollow silica particles is too large, the refractive index of the low-refractive index layer decreases excessively. Also, the value of $\Sigma_T$ of the optical film tends to be less likely to meet the above range. Therefore, the content of the hollow silica particles is preferably 200 parts by mass or less, more preferably 180 parts by mass or less, further preferably 160 parts by mass or less, with respect to 100 parts by mass of the binder resin.

The content of non-hollow silica particles is preferably 20 parts by mass or more and more preferably 40 parts by mass or more with respect to 100 parts by mass of the binder resin in order to obtain favorable scratch resistance of the low-refractive index layer.

Meanwhile, when the content of the non-hollow silica particles is excessively large, the non-hollow silica tend to aggregate. Therefore, the content of the non-hollow silica particles is preferably 100 parts by mass or less, more preferably 80 parts by mass or less, with respect to 100 parts by mass of the binder resin.

The binder resin of the low-refractive index layer preferably contains a cured product of an ionizing radiation curable resin composition.

The ionizing radiation curable resin composition is a composition containing a compound having an ionizing radiation curable functional group (which will be hereinafter referred to as "ionizing radiation curable compound"). Examples of the ionizing radiation curable functional group include ethylenically unsaturated linking groups such as a (meth)acryloyl group, a vinyl group, and a allyl group, as well as an epoxy group and an oxetanyl group.

The ionizing radiation curable compound is preferably a compound having an ethylenically unsaturated linking group, more preferably a compound having two or more ethylenically unsaturated linking groups, and among them, a polyfunctional (meth)acrylate compound having two or more ethylenically unsaturated linking groups is still more preferable. As a polyfunctional (meth)acrylate compound, any of monomer or oligomer may be used.

The ionizing radiation means electromagnetic waves or charged particle beams with energy quanta allowing for polymerization or cross-linking of molecules. Usually, ultraviolet rays (UV) or electron beams (EB) are used. In addition, electromagnetic waves such as X-rays, and γ-rays or charged particle beams such as α-rays and ion beams can also be used.

Among the polyfunctional (meth)acrylate compounds, examples of a bifunctional (meth)acrylate monomer include ethylene glycol di(meth)acrylate, bisphenol A tetraethoxydiacrylate, bisphenol A tetrapropoxydiacrylate, or 1,6-hexanediol diacrylate.

Examples of a trifunctional or more (meth)acrylate monomer include trimethylolpropane tri(meth)acrylate, pentaerythritol tri(meth)acrylate, pentaerythritol tetra(meth)acrylate, dipentaerythritol hexa(meth)acrylate, dipentaerythritol tetra(meth)acrylate, and isocyanurate-modified tri(meth)acrylate.

The above (meth)acrylate monomers may be partially modified in the molecular skeleton. It is possible to use those modified with, for instance, ethylene oxide, propylene oxide, caprolactone, isocyanuric acid, alkyl, cyclic alkyl, aromatic group, or bisphenol.

Examples of polyfunctional (meth)acrylate oligomers include acrylate polymers such as urethane(meth)acrylate, epoxy(meth)acrylate, polyester(meth)acrylate, and polyether(meth)acrylate.

The urethane(meth)acrylate can be obtained, for example, by reaction of a polyhydric alcohol, an organic diisocyanate, and hydroxy(meth)acrylate.

A preferable epoxy(meth)acrylate is a (meth)acrylate obtained by reaction of (meth)acrylic acid with an aromatic epoxy resin, an alicyclic epoxy resin, an aliphatic epoxy resin or the like with three or more functionalities, a (meth)acrylate obtained by reaction of (meth)acrylic acid with an aromatic epoxy resin, an alicyclic epoxy resin, an aliphatic epoxy resin or the like with two or more functionalities and polybasic acid, and a (meth)acrylate obtained by reaction of (meth)acrylic acid with an aromatic epoxy resin, an alicyclic epoxy resin, an aliphatic epoxy resin or the like with two or more functionalities and a phenol.

One kind of the ionizing radiation curable compound may be used singly, or two or more kinds may be used in combination.

When the ionizing radiation curable compound is a UV curable compound, the ionizing radiation curable resin composition preferably contains an additive(s) such as a photopolymerization initiator and/or a photopolymerization-promoting agent.

Examples of the photopolymerization initiator include at least one selected from the group consisting of acetophenone, benzophenone, α-hydroxyalkylphenone, Michler ketone, benzoin, benzyl dimethyl ketal, benzoyl benzoate, an α-acyl oxime ester, α-aminoalkylphenone, anthraquinone, halogenoketone, and a thioxanthone compound.

The photopolymerization-promoting agent can reduce the inhibition of polymerization by air during curing and accelerate the curing speed. Examples include at least one selected from the group consisting of a p-dimethylaminobenzoic acid isoamyl ester and a p-dimethylaminobenzoic acid ethyl ester.

The low-refractive index layer may contain a leveling agent for antifouling properties and surface smoothness. Examples of the leveling agent include a fluorine or silicone leveling agents, and a silicone leveling agent is preferable. Inclusion of a silicone leveling agent can improve the slipperiness and antifouling properties of the surface of the low reflectance layer. Specific examples of "favorable antifouling properties" include a favorable fingerprint wiping property and a large contact angle with respect to pure water and hexadecane.

The content of the leveling agent is preferably 0.01 part by mass or more and 10 parts by mass or less, more preferably 0.05 parts by mass or more and 1 parts by mass or less, with respect to 100 parts by mass of the binder resin.

The low-refractive index layer, for example, can be formed by applying and drying a coating solution for forming low-refractive index layers that is obtained by dissolving or dispersing components constituting the low-refractive index layer. A solvent may be contained in the coating solution for forming a low-refractive index layer to adjust the viscosity and to make each component dissolvable or dispersible.

<Reflectance>

The optical film of the present disclosure has a visual reflectance Y value, as measured from the low-refractive index layer side, of preferably 4.0% or less, more preferably 2.0% or less, still more preferably 1.7% or less, and still more preferably 1.5% or less.

If the visual reflectance of the optical film is too low, the value of $\Sigma_T$ tends to be less likely to meet the above range. Thus, the visual reflectance Y value is preferably 0.5% or more, more preferably 0.7% or more, and still more preferably 1.0% or more.

As used herein, the term "visual reflectance Y value" refers to the visual reflectance Y value of the CIE 1931 standard color system. The reflectance is preferably measured at any 10 points of one sample and calculated as the average of the values at 8 points excluding the maximum and minimum values.

In this description, the reflectance of the optical film is measured by producing a sample bonded with a black plate via a transparent pressure-sensitive adhesive layer on the side opposite to the surface on which the reflectance of the optical film is measured and allowing light to be incident from the low-refractive index layer side of the sample at an incident angle of 5°. The light source for measuring the reflectance is preferably a C light source.

The difference in refractive index between member in contact with the transparent pressure-sensitive adhesive layer of the sample (for example, the plastic film) and the transparent pressure-sensitive adhesive layer is preferably 0.15 or less, more preferably 0.10 or less, more preferably 0.05 or less, more preferably 0.01 or less. The black plate preferably has a total light transmittance according to JIS K7361-1:1997 of 1% or less, more preferably 0%. The difference between the refractive index of the resin constituting the black plate and the refractive index of the transparent pressure-sensitive adhesive layer is preferably 0.15 or less, more preferably 0.10 or less, more preferably 0.05 or less, more preferably 0.01 or less.

<Haze and Total Light Transmittance>

The optical film preferably has a haze according to JIS K7136:2000 of 5% or less, more preferably 4% or less, further preferably 3% or less. When anti-glare property is required, the upper limit of haze of the optical film may be 90% or less, 65% or less, or 40% or less. The optical film has a haze according to JIS K7136:2000 of preferably 0.5% or more, more preferably 1.0% or more, and still more preferably 1.5% or more. The above-mentioned haze means the haze of the entire optical film.

The optical film has a total light transmittance according to JIS K7361-1:1997 of preferably 80% or more, more preferably 90% or more, still more preferably 91% or more, and still more preferably 92% or more.

<Other Layers>

The optical film of the present disclosure may have layers other than the plastic film and the low-refractive index layer. The low-refractive index layer and layers other than the low-refractive index layer are preferably optically isotropic. The optically isotropic layers mean layers having an in-plane phase difference of less than 20 nm, preferably 10 nm or less, more preferably 5 nm or less.

Examples of the additional layer other than plastic film and the low-refractive index layer include an antifouling layer, a hard coating layer, an anti-glare layer, or a high-refractive-index layer. Preferred are a hard coating layer and an anti-glare layer. That is, the optical film of the present disclosure preferably has, between the plastic film and the low-refractive index layer, one or more layers selected from the group consisting of a hard coating layer and an anti-glare layer. Among them, the hard coating layer is preferable. An antifouling layer may be included on the low-refractive index layer on a side opposite to the plastic film as long as the effects of the optical film of the present disclosure are not inhibited. For example, the plastic film, the low-refractive index layer, and the antifouling layer may be placed in this order as long as the effects of the optical film of the present disclosure are not inhibited.

<<Hard Coating Layer>>

The hard coating layer is formed for improving the scratch resistance of the optical film, as required. The hard coating layer is preferably formed between the plastic film and the low-refractive index layer. In the case where the optical film further has a high-refractive index layer, the hard coating layer, the high-refractive index layer, and the low-refractive index layer are preferably disposed on the plastic film in this order.

The hard coating layer preferably contains a cured product of a curable resin composition such as a thermosetting resin composition or an ionizing radiation curable resin composition, more preferably a cured product of an ionizing radiation curable resin composition, for improve the scratch resistance.

The thermosetting resin composition is a composition containing at least a thermosetting resin and is a resin composition cured by heating. Examples of the thermosetting resin include acrylic resins, urethane resins, phenolic resins, urea melamine resins, epoxy resins, unsaturated polyester resins, and silicone resins. In the thermosetting resin composition, a curing agent is added to such a curable resin, as required.

The ionizing radiation curable resin composition of the hard coating layer is substantially the same as the ionizing radiation curable resin composition exemplified for the low-refractive index layer.

The ionizing radiation curable resin composition of the hard coating layer preferably contains a polyfunctional (meth)acrylate oligomer as the ionizing radiation curable compound. The lower limit of the number-average molecular weight of the polyfunctional (meth)acrylate oligomer is preferably 2000 or more and more preferably 2500 or more, and the upper limit is preferably 6000 or less and more preferably 5000 or less.

A solvent and an ionizing radiation curable compound in the coating solution for forming a low-refractive index layer easily penetrate into the hard coating layer formed from the composition containing a polyfunctional (meth)acrylate oligomer with a number-average molecular weight of 2000 or more. This allows for suppression of reflection at the interface between the hard coating layer and the low-refractive index layer. This also makes it easier to suppress the interference of light reflected on the optical film and to keep the $\Sigma_T$ in the above range.

The hard coating layer formed from the composition containing a polyfunctional (meth)acrylate oligomer with a number-average molecular weight of 6,000 or less can make it easier to suppress the decrease in hardness of the hard coating layer.

The content of the polyfunctional (meth)acrylate oligomer with a number-average molecular weight of 2000 or more and 6000 or less is preferably 5 mass % or more, more preferably 10 mass % or more, and still more preferably 12 mass % or more based on the total amount of the ionizing radiation curable compound in the ionizing radiation curable resin composition of the hard coating layer.

The thickness of the hard coating layer is preferably 0.1 µm or more, more preferably 0.5 µm or more, further preferably 1.0 µm or more, even more preferably 2.0 µm or more, for improve the scratch resistance. The thickness of the hard coating layer is preferably 100 µm or less, more preferably 50 µm or less, more preferably 30 µm or less, more preferably 20 µm or less, more preferably 15 µm or less, more preferably 10 µm or less, for suppressing curling.

<<Anti-Glare Layer>>

The anti-glare layer can be formed, for example, from a coating solution for forming anti-glare layers, containing a binder resin composition and particles. As the binder resin composition, curable resin compositions described as examples for the hard coating layer can be used, for example.

As the particles, both organic particles and inorganic particles can be used. Examples of the organic particles include particles made of polymethylmethacrylate, polyacrylic-styrene copolymer, melamine resin, polycarbonate, polystyrene, polyvinyl chloride, benzoguanamine-melamine-formaldehyde condensate, silicone, fluororesin, and polyester resin. Examples of the inorganic particles include particles made of silica, alumina, antimony, zirconia, and titania.

The average particle size of the organic particles in the anti-glare layer cannot be said unconditionally since it varies depending on the thickness of the anti-glare layer but is preferably 0.5 µm or more and 10.0 µm or less, more preferably 1.0 µm or more and 8.0 µm or less, further preferably 1.5 µm or more and 6.0 µm or less.

Inorganic particles tend to agglomerate. For this reason, the average particle size of inorganic particles is not limited to the above and is preferably 1 nm or more and 10 μm or less.

The average particle size of particles in the anti-glare layer may be calculated by the following procedures (z1) to (z3).

(z1) Capture an image of the anti-glare layer by using an optical microscope or STEM. If the average particle size of particles is on the order of microns, it is preferable to use an optical microscope to capture an image of the plane surface of the anti-glare layer. At that time, the magnification is preferably 500× or more and 2000× or less. If the average particle size of particles is on the nano-order, it is preferable to use a STEM to capture an cross-sectional image of the anti-glare layer. At that time, the magnification is preferably 20,000× or more and 100,000× or less. The acceleration voltage of STEM is preferably 10 kV or more and 30 kV or less.

(z2) Extract any ten particles from the observation image to calculate the particle size of individual particles. The particle size is measured as a linear distance in a combination of any two parallel straight lines sandwiching each particle in cross section in which the distance between the two straight lines is maximum.

(z3) Repeat the same operation five times in an observation image on another screen of the same sample and use the value obtained from the number average of the particle sizes of fifty particles in total as the average particle size of the particles in the anti-glare layer.

The content of the particles in the anti-glare layer cannot be said unconditionally since it varies depending on the degree of target anti-glare properties, but is preferably 1 part by mass or more and 100 parts by mass or less, more preferably 5 parts by mass or more and 50 parts by mass or less, further preferably 10 parts by mass or more and 30 parts by mass or less, with respect to 100 parts by mass of the resin component.

The anti-glare layer may contain fine particles with an average particle size of less than 500 nm, for imparting antistatic properties, controlling the refractive index, or adjusting the shrinkage of the anti-glare layer due to curing of the curable resin composition.

The thickness of the anti-glare layer is preferably 0.5 μm or more, more preferably 1.0 μm or more, further preferably 2.0 μm or more. Further, the thickness of the anti-glare layer is preferably 50 μm or less, more preferably 30 μm or more, more preferably 20 μm or less, more preferably 15 μm or less, more preferably 10 μm or less. To improve the hardness of the anti-glare layer, the thickness of the anti-glare layer is preferably thicker than the average particle size of the particles.

<Example of Layer Configuration>

The following (1) to (5) are examples of the layer configuration of each optical film of the present disclosure. Among the following configurations, (2) and (4) are preferable.

(1) Configuration having a low-refractive index layer on a plastic film.
(2) A configuration of having the hard coating layer and the low-refractive index layer on the plastic film in this order.
(3) A configuration of having the high-refractive index layer and the low-refractive index layer on the plastic film in this order.
(4) A configuration of having the anti-glare layer and the low-refractive index layer on the plastic film in this order.
(5) A configuration of having the hard coating layer, the high-refractive index layer, and the low-refractive index layer on the plastic film in this order.

<Form and Size>

The optical film may be in the form of a sheet cut into a predetermined size or may be in the form of a roll obtained by winding a long sheet into a roll. The size of the sheet is not specifically limited, but the maximum diameter is about 2 inch or more and 500 inch or less. In this disclosure, the size of the sheet is preferably 30 inches or more and 100 inches or less and more preferably 40 inches or more and 100 inches or less. The "maximum diameter" refers to the maximum length when any two points in the optical film are connected. For example, in the case where the optical film is rectangular, the diagonal line of the rectangular area is the maximum diameter. In the case where the optical film is circular, the diameter is the maximum diameter.

The width and the length of the roll is not specifically limited, but in general, the width is 500 mm or more and 5,000 mm or less, and the length is about 100 m or more and 5,000 m or less. The optical film in the form of a roll form can be cut into a sheet according to the size of an image display device or the like for use. When cutting, it is preferable to exclude the edge of the roll where the physical properties are not stable.

The shape of the sheet is not specifically limited and may be, for example, a polygon (such as a triangle, a rectangle, and a pentagon), a circle, or a random amorphous shape. In the case where the optical film is a rectangle, the aspect ratio of the rectangle is not specifically limited, as long as there is no problem as a display screen. Examples of the ratio include horizontal:vertical=1:1, 4:3, 16:10, 16:9, 2:1, and 5:4.

<Applications>

The optical film of the present disclosure can be suitably used as an optical film for image display devices.

Further, the optical film of the present disclosure can be suitably used as an optical film to be disposed on the light emitting surface side of a display element of an image display device. At this time, a polarizer is preferably provided between the display element and the optical film of the present disclosure.

In the case where the plastic film satisfies the condition A, it is possible to suppress folding habits remaining after the folding test or breakage, regardless of the folding direction. Therefore, in the case where the plastic film satisfies the condition A, it can be more preferably used as a plastic film for curved image display devices and foldable image display devices.

The optical film of the present disclosure may also be used as a member during production of a functional film. For example, in a transfer sheet having a transfer layer on a substrate, the optical film of the present disclosure may be used as the substrate. In this case, the transfer layer may be formed on a side opposite to the low-refractive index layer side of the plastic film. In addition, examples of the member include a substrate used to protect or reinforce a functional film during production of the functional film.

[Polarizing Plate]

A polarizing plate of the present disclosure include: a polarizer; a first transparent protective plate disposed on one side of the polarizer; and a second transparent protective plate disposed on the other side of the polarizer, wherein at least one selected from the group consisting of the first transparent protective plate and the second transparent protective plate is the above-described optical film of the present disclosure, and a surface on the low-refractive index layer side of the optical film faces a side opposite to the polarizer.

FIG. 3 is a sectional view showing an embodiment of the polarizing plate 700 of the present disclosure. The polarizing plate 700 in FIG. 3 has the polarizer 300, a first transparent protective plate 500 disposed on one side of the polarizer, and a second transparent protective plate 600 disposed on the other side of the polarizer. The polarizing plate 700 in FIG. 3 uses the optical film 100 as the first transparent protective plate 500. In FIG. 3, regarding the optical film 100, a surface of the optical film on the low-refractive index layer 30 side faces a side opposite to the polarizer 300. In the polarizing plate 700 in FIG. 3, the polarizer 300, the first transparent protective plate 500 and the second transparent protective plate 600 are laminated via the adhesive layer 400.

The polarizing plate is used, for example, for imparting anti-reflection properties in combination with a λ/4 phase difference plate. In this case, the λ/4 phase difference plate is disposed on the display element of an image display device, and the polarizing plate is disposed on the viewer side to the λ/4 phase difference plate.

The polarizing plate for a liquid crystal display device is used to provide a liquid crystal shutter function. In this case, the liquid crystal display device includes, in sequence from the backlight side, a lower polarizing plate, a liquid crystal display element, and an upper polarizing plate. The absorption axis of the polarizer of the lower polarizing plate is disposed orthogonal to the absorption axis of the polarizer of the upper polarizing plate. In a configuration of the liquid crystal display device, polarizing plates of the present disclosure may be used as the upper polarizing plate and the lower polarizing plate. It is preferable to use the polarizing plate of the present disclosure as the upper polarizing plate. In the upper polarizing plate, it is preferable to use the optical film of the present disclosure as a transparent protective plate on the light emitting surface side of the polarizer. In the lower polarizing plate, it is preferable to use the optical film of the present disclosure as a transparent protective plate on the light incident surface side of the polarizer.

<Transparent Protective Plate>

The polarizing plate of the present disclosure uses the optical film of the present disclosure as at least one selecting from the group consisting of the first transparent protective plate and the second transparent protective plate. It is preferable that both the first transparent protective plate and the second transparent protective plate are the optical films of the present disclosure.

In the case where one of the first transparent protective plate and the second transparent protective plate is the optical film of the present disclosure, the other transparent protective plate is not specifically limited but is preferably an optically isotropic transparent protective plate. In this description, the optically isotropic transparent protective plate refers to those having an in-plane phase difference of less than 20 nm, preferably 10 nm or less, more preferably 5 nm or less. Examples of the optically isotropic transparent protective plate include an acrylic film, a triacetyl cellulose film, a polycarbonate film, or an amorphous olefin film.

<Polarizer>

Examples of the polarizer include a sheet-type polarizer formed by stretching a film stained with iodine or the like (such as polyvinyl alcohol films, polyvinyl formal films, polyvinyl acetal films, and ethylene-vinyl acetate copolymer saponification films), a wire grid polarizer consisting of many metal wires aligned in parallel, a coated polarizer coated with lyotropic liquid crystal and dichroic guest-host material, and a multilayer thin film-type polarizer. Such a polarizer may be a reflective polarizer having a function of reflecting polarization components that do not transmit.

The polarizer is preferably disposed so that the angle formed by the absorption axis and the slow axis of the plastic film falls within 90 degrees±5 degrees. The angle is more preferably within 90 degrees±3 degrees, further preferably within 90 degrees±1 degree.

[Image Display Device]

The image display device of the present disclosure is an image display device having a display element, and a polarizer and an optical film disposed on the light emitting surface side of the display element, wherein the optical film is the optical film of the present disclosure, and that the surface on the low-refractive index layer side of the optical film faces the side opposite to the display element.

FIG. 4 is a sectional view showing an embodiment of the image display device of the present disclosure.

The image display device 1000 shown in FIG. 4 has an optical film 100 on the light emitting surface side (upper side in FIG. 4) of a display element 800. In FIG. 4, regarding the optical film 100, a surface on the low-refractive index layer side of the optical film faces a side opposite to the display element 800. Each image display device 100 shown in FIG. 4 has a polarizer 300 between the display element 800 and the optical film 100.

The image display device 1000 is not limited to the form shown in FIG. 4. For example, the members constituting the image display device 1000 are disposed at predetermined intervals in FIG. 4, but the members are preferably integrally laminated via adhesive layers or the like. The image display device may have a member(s) not shown such as an additional optical film. For example, the image display device may have a surface plate such as a glass plate or a plastic plate. When the image display device has a surface plate, the optical film of the present disclosure may be laminated onto the surface plate.

In the image display device of the present disclosure, the angle formed by the absorption axis of the polarizer and the slow axis of the plastic film of the optical film falls preferably within 90 degrees±5 degrees. The angle falls more preferably within 90 degrees±3 degrees and still more preferably within 90 degrees±1 degree.

<Display Element>

Examples of the display element include a liquid crystal display element, an EL display element (e.g., an organic EL display element, an inorganic EL display element), a plasma display element, or a display element using a quantum dot (QD). Further examples include an LED display element (e.g., a mini-LED or micro-LED display element).

In the case where the display element of the display device is a liquid crystal display element, a backlight is required on the surface of the liquid crystal display element opposite to the resin sheet.

The image display device may be an image display device having a touch panel function.

Examples of the touch panel include a resistance film type, a capacitance type, an electromagnetic induction type, an infrared type, and an ultrasonic type.

The touch panel function may be one in which a function is added in the display element such as an in-cell touch panel liquid crystal display element or may be one in which a touch panel is placed on the display element.

The optical film can suppress folding habits remaining after the folding test or breakage, as long as the plastic film satisfies the condition A. Therefore, the image display device is preferably a curved image display device or a foldable image display device, as long as the plastic film satisfies the condition A.

In the case where the image display device is a curved image display device or a foldable image display device, the display element is preferably an organic EL display element. When the image display device is a curved image display device or a foldable image display device, the glass included in the image display device is preferably thin glass. The thickness of the thin glass is preferably 5 μm or more and 80 μm or less.

<Other Plastic Films>

The image display device of the present disclosure may have other plastic films, as long as the effects of the present disclosure are not inhibited.

The other plastic films are preferably optically isotropic.

[Method for Selecting Optical Film of Image Display Device]

The method for selecting an optical film of an image display device according to the present disclosure is a method for selecting an optical film of an image display device including a display element, and a polarizer and an optical film disposed on a light emitting surface side of the display element, the method including selecting, as the optical film, an optical film X satisfying the following determination conditions (1) to (4):

(1) the optical film X has a low-refractive index layer on a plastic film;
(2) the plastic film has a slow axis that is an axis with the largest refractive index in a plane, and a fast axis that is an axis orthogonal to the slow axis in the plane of the plastic film;
(3) the low-refractive index layer is located on the surface of the optical film; and
(4) the optical film X has a region in which $\Sigma_T$ calculated from the following measurement condition 1 satisfies more than 0.04 and less than 0.20.

<Measurement Condition 1>

When linearly polarized light is incident from a surface on a side opposite to the low-refractive index layer of the optical film; the linearly polarized light that is incident light is defined as light L1; transmitted light that is the light L1 transmitting through the optical film is defined as light L2;

the light L1 is incident on the optical film at angles disposed such that an elevation angle in a vibration direction of the light L1 with respect to the plane of the optical film is 50 degrees or more and 70 degrees or less while an angle formed by the slow axis and the vibration direction of the light L1 is fixed at 45 degrees; the elevation angle is varied in a range of 50 degrees or more and 70 degrees or less by every 2 degrees, and the light L2 is subject to measurements at 11 different elevation angles; the light L2 is measured at 11 measurement points as in the measurements;

the light L2 is subject to conversion into conditions of a C light source and at a viewing angle of 2 degrees; a* value and b* value at an $n^{th}$ measurement point among the 11 measurement points of the light L2 and in an L*a*b* color system are defined as a*n and b*n, respectively; a* value and b* value at an $(n+1)^{th}$ measurement point among the 11 measurement points of the light L2 and in the L*a*b* color system are also defined as a*n1 and b*n1, respectively; and the measurements at the 11 measurement points are used to calculate a sum of square of a difference in a* between adjacent measurement points and square of a difference in b* between the adjacent measurement points; and the sum is calculated for each of 10 adjacent points and $\Sigma_T$ indicating a total of the sums is calculated, the $\Sigma_T$ can be expressed by the following formula 1:

$$\Sigma_T = Y[\{a^*n - a^*n1\}^2 + \{b^*n - b^*n1\}^2] \quad \text{(formula 1)}.$$

In the method for selecting an optical film of an image display device according to the present disclosure, the angle formed by the absorption axis of the polarizer and the slow axis of the plastic film of the optical film falls preferably within 90 degrees±5 degrees. The angle falls more preferably within 90 degrees±3 degrees and still more preferably within 90 degrees±1 degree.

The embodiment of measurement condition 1 in the method for selecting an optical film of an image display device according to the present disclosure is the same as the embodiment of measurement condition 1 for the optical film of the present disclosure described above.

The method for selecting an optical film of an image display device according to the present disclosure preferably has a further additional determination condition as a determination condition. Examples of the additional determination condition include suitable embodiments of the optical film of the present disclosure (e.g., formula 2-1, formula 2-2, n2/n1, the in-plane phase difference of the plastic film).

The method for selecting an optical film of an image display device of the present disclosure is useful as a method for selecting an optical film of an image display device having a polarizer on a surface on the light emitting surface side of a display element.

EXAMPLES

Next, the present disclosure will be described further in detail by way of Examples, but the present disclosure is not limited by these examples at all.

1. Measurement and Evaluation

The atmosphere for the following measurements and evaluations should be at a temperature of 23° C.±5° C. and a relative humidity of 40% or more and 65% or less. In addition, the samples for measurement should be exposed to the above atmosphere for 30 minutes or more and 60 minutes or less before the measurement and evaluation. The samples for measurement should be collected from a clean part(s) without any damage. The measurement and the evaluation should be performed with the sample in good flatness.

1-1. Measurement Under Measurement Condition 1

A 5 cm×5 cm sample was cut out from an optical film of each Experimental Example. Measurement condition 1 was performed to the sample. The measuring device used was a JASCO Corporation spectrophotometer product number "V-7100". The above measurement results were used to calculate the "$\Sigma_T$ in formula 1", the "(a*max−a*min) in formula 2-1", the "(b*max−b*min) in formula 2-2", and the "the maximum value of sum ($S_{MAX}$)". Under measurement condition 1, a sum of square of a difference in a* between adjacent measurement points and square of a difference in b* between the adjacent measurement points is calculated for each of the 10 adjacent points. The "maximum value of sum ($S_{MAX}$)" means the maximum value of sum among the 10 points. The visual reflectance Y value of the optical film in each Experimental Example was defined as "R (%)", and the "R×$\Sigma_T$" was then calculated (the visual reflectance Y value was measured by the method described in the section 1-6 below). Table 1 shows the results.

1-2. n1 and n2

The average refractive index n1 of the low-refractive index layer was measured for the optical film in each Experimental Example by a combination of the Becke's method and the fitting method described in the text of specification.

The average refractive index n2 of a layer adjacent to the low-refractive index layer was also measured for the optical film in each Experimental Example. The layer adjacent to the low-refractive index layer may be a plastic film or a hard coating layer. In either case, n2 was measured by the Becke's method described in the text of specification. Table 1 shows the results.

1-3. Rainbow Unevenness

A liquid crystal display device having a polarizer on a liquid crystal display element (product name "EV2450", available from EIZO, horizontal: 527.0 mm, vertical: 596.4 mm, the absorption axis of the polarizer being in parallel to the vertical direction of the screen, backlight: backlight using white light emitting diode) was prepared.

Each laminate was produced by laminating the optical film in each Experimental Example via an adhesive layer on the above-described liquid crystal display device. At that time, the absorption axis of the polarizer and the slow axis of the plastic film of the optical film were arranged at 90 degrees. The laminate was displayed in white in a darkroom environment and was viewed from every position and in every direction at a distance of 30 cm or more and 100 cm or less from the laminate. Evaluators were healthy individuals in the 20s to 40s with visual acuity of 0.7 or better, and the presence or absence of rainbow unevenness was evaluated with the naked eyes according to the following criteria. The above visual acuity includes corrected visual acuity. Table 1 shows the results.

AA: No rainbow unevenness is visible when viewed from every position and in every direction.

A: There are some positions where rainbow unevenness is visible in a very small area, or there are some directions where rainbow unevenness is visible in a very small area.

B: There are many positions where rainbow unevenness is visible in a very small area, or there are many directions where rainbow unevenness is visible in a very small area.

B—: There are many positions where rainbow unevenness is visible in a small area, or there are many directions where rainbow unevenness is visible in a small area.

C: There are many positions where rainbow unevenness is visible in the majority of area, or there are many directions where rainbow unevenness is visible in the majority of area.

1-4. Color Tone Uniformity

Each laminate produced in 1-3 was visually observed in a light room environment with the power turned off. The light room conditions were set such that the brightness of the laminate surface was in the range of 1000 lux or more and 1500 lux or less. Observations were performed from three directions: from the front of the laminate, at about 50 degrees with reference to the laminate, and at about 70 degrees with reference to the laminate. The distance between the laminate and the evaluator's eyes was 30 cm or more and 100 cm or less. Evaluators were 20 healthy individuals in the 20s to 40s with visual acuity of 0.7 or better, and the color tone uniformity when viewed at an oblique angle was evaluated according to the following criteria. Table 1 shows the results.

A: 18 or more evaluators answered that they did not perceive any color tone change when color tones in the three directions were compared.

B: 15 or more and 17 or less evaluators answered that they did not perceive any color tone change when color tones in the three directions were compared.

C: 10 or more and 14 or less evaluators answered that they did not perceive any color tone change when color tones in the three directions were compared.

D: 5 or more and 9 or less evaluators answered that they did not perceive any color tone change when color tones in the three directions were compared.

E: 4 or less evaluators answered that they did not perceive any color tone change when color tones in the three directions were compared.

1-5. Color Saturation Based on Reflected Light

A black plate (KURARAY CO., LTD; product name "COMOGLAS DFA2CG 502K (Black)type" with a total light transmittance of 0%, at a thickness of 2 mm, and with a refractive index of 1.49) was attached via a transparent adhesive layer (PANAC CO., LTD.; product name "Panaclean PD-Si" with a refractive index of 1.49) with a thickness of 25 μm to the plastic film side of the optical film in each Experimental Example to prepare each sample (5 cm×5 cm).

Light was incident on the sample from 5 degrees, 50 degrees, or 70 degrees while 0 degrees were set to a direction perpendicular to the surface of the sample on the low-refractive index layer side. Then, color saturation was measured based on the specularly reflected light of the incident light. For each sample, the color saturation was measured at 10 points, and the average value was defined as the color saturation at the angles for the sample. The color saturation (C*) can be calculated using the following formula based on the a* value and b* value of the L*a*b* color system.

$$C^* = \{(a^*)^2 + (b^*)^2\}^{1/2}$$

The measuring device used was a JASCO Corporation spectrophotometer product number "V-7100". The above-mentioned measuring device was used for measurement in the wavelength range of 380 nm or more and 780 nm or less. Then, the values were converted to the brightness perceived by human eyes while using software [built-in software <product number "JASCO spectrum manager", manufactured by JASCO Corporation> in the measuring device under reflectance calculating conditions with a C light source and at a viewing angle of 2 degrees]. Table 1 shows the results.

The color saturation was not measured for the optical film without any low-refractive index layer.

1-6. Visual Reflectance Y Value (Reflectance)

For each sample produced in the section 1-5, light was incident on the sample from 5 degrees while 0 degrees were set to a direction perpendicular to the surface of the sample on the low-refractive index layer side. The reflectance (visual reflectance Y value) was measured based on the specularly reflected light of the incident light.

The measuring device used was a JASCO Corporation spectrophotometer product number "V-7100". The above-mentioned measuring device was used for measurement in the wavelength range of 380 nm or more and 780 nm or less. Then, the values were converted to the brightness perceived by human eyes while using software [built-in software <product number "JASCO spectrum manager", manufactured by JASCO Corporation> in the measuring device under reflectance calculating conditions with a C light source and at a viewing angle of 2 degrees]. For each sample, the reflectance was measured at 10 points, and the average value was defined as the visual reflectance Y value for the sample. Table 1 shows the results.

The visual reflectance Y value was not measured for the optical film without any low-refractive index layer.

1-7. In-Plane Phase Difference (Re), Phase Difference in Thickness Direction (Rth), and Slow Axis Direction From the plastic films produced or prepared in section "2" below to be used in Experimental Examples and Reference Examples, a sample of 50 mm in vertical×50 mm in horizontal was cut out. At that time, the flow direction (MD direction) of the plastic film was regarded as the vertical direction, and the width direction (TD direction) of the plastic film was regarded as the horizontal direction. The in-plane phase difference, the phase difference in the thickness direction, and the slow axis direction were measured at a total of five points including four points 10 mm advanced from the four corners of each the sample toward the center and the center of the sample. From the measurement results, the Re1 to Re5 were, for example, averaged. Table 2 shows the results.

The measuring device used was product name "RETS-100 (measurement spot: diameter 5 mm)", available from Otsuka Electronics Co., Ltd. The slow axis direction was measured in the range of 0 degrees or more and 90 degrees or less with the flow direction (MD direction) of the plastic film taken as 0 degrees as a reference.

1-8. Folding Resistance

<Td Direction>

A strip-shaped sample of 30 mm in the width direction (TD direction)×100 mm in the flow direction (MD direction) was cut out from each plastic film used in Experimental Examples or Reference Examples as produced or prepared in the section "2" below. A repeated folding test was conducted 100,000 times by using a durability tester (product name "DLDMLH-FS", manufactured by YUASA SYSTEM CO., LTD.), in which both ends of the sample on the short side (30-mm side) were fixed and then folded 180 degrees. At both ends of the sample on the short side, each site 10 mm away from the tip of the sample was fixed. The folding speed was 120 times per minute. A more detailed technique of the folding test was as follow.

After the folding test, the strip-shaped sample was placed on a horizontal table, and the angle at which the edge of the sample rise from the table was measured. If the angle was 15 degrees or less, it is acceptable. If the sample broke in the middle of the test, it was shown as "broken". Table 2 shows the results. This evaluation can be used to evaluate the folding resistance in the TD direction (~ slow-axis direction).

<Md Direction>

A strip-shaped sample of 30 mm in the flow direction (MD direction)×100 mm in the width direction (TD direction) was cut out from each biaxially stretched plastic film used in Experimental Examples or Comparative Examples as produced or prepared in the section "2" below, and was subjected to the same evaluation as above. This evaluation can be used to evaluate the folding resistance in the MD direction (≅fast-axis direction).

<Details of Folding Test>

First, a side portion 10C of the plastic film 10 and a side portion 10D facing the side portion 10C were respectively fixed by fixing portions 60 disposed in parallel in the repeated folding test, as shown in FIG. 6(A). Each fixing portion 60 was slidable in the horizontal direction.

Then, the fixing portions 60 were moved so as to come close to each other, so that the plastic film 10 was deformed to be folded, as shown in FIG. 6(B). Further, as shown in FIG. 6(C), the fixing portions 60 were moved to the positions where the interval between the two side portions facing each other fixed by the fixing portions 60 of the plastic film 10 was 10 mm, and then the fixing portions 60 were moved in the reverse direction to eliminate the deformation of the plastic film 10.

As shown in FIG. 6(A) to FIG. 6(C), the plastic film 10 can be folded 180 degrees by moving the fixing portions 60. Further, the interval between the two side portions facing each other of the optical film 10 can be adjusted to 10 mm by performing the repeated folding test so that a bent portion 10E of the plastic film 10 does not protrude from the lower ends of the fixing portions 60 and controlling the interval when the fixing portions 60 are closest to each other to 10 mm.

1-9. Pencil hardness

Pencil hardness was measured for polyester films 1 to 5 in the section "2" below. The method of measuring a pencil hardness was according to the procedures (1) to (6) in the text of specification. For commercially available polyester films with adhesive coating on one side, the pencil hardness of the side without the adhesive coating layer was measured. The pencil hardness was measured for both the slow and the fast axes. Table 2 shows the results.

1-10. Erosion Rate

An erosion rate-measuring device (MSE tester, product number "MSE-A203", manufactured by Palmeso Co., Ltd.; nozzle cross-sectional shape: 1 mm×1 mm square; means for measuring a cross-sectional profile: stylus type) was used to measure the erosion rates of polyester films 1 to 5 as described in the section "2" below, thereby calculating each $E_{0-20}$. The erosion rate measurement area is 1 mm×1 mm.

The erosion rate of each sample was measured after the following calibration using a standard acrylic plate. In addition, each test solution was prepared before the calibration, and a preliminary distributed operation was conducted before the calibration. Here, the above standard acrylic plate gave an AcE (average of erosion rates of acrylic plate as measured under the measurement condition A), as described in the text of specification, within the range of 1.786 µm/g or more and 1.974 µm/g or less.

(0-1) Preparation of Test Solution

The test solution was prepared by mixing, with a glass rod in a beaker, pure water, a dispersing agent (product name "DEMOL N" by Wako Pure Chemical Industries, Ltd.), and spherical silica (model number "MSE-BS-5-3" designated by Palmeso Co., Ltd.; full width at half maximum of particle size distribution: 4.2 µm) with an average particle size (median diameter) of 3.94 µm at the mass ratio of 968:2:30. The prepared test solution and a stirring bar is placed in a container (pot), and the pot was then covered with a lid and a clamp was attached. Next, the pot was installed in the measuring device. In the Examples, as the model number "MSE-BS-5-3" designated by Palmeso Co., Ltd., the product number "BS5-3" of Potters-Ballotini Co., Ltd. was used.

(0-2) Distributed Operation

The pot containing the test solution was installed in the measuring device, and a dummy sample was then set on the sample mount. Next, the buttons "Erosion force setting" and "Perform" on the control panel of the main unit of the measuring device were pressed in this order. Then, the prescribed values were entered as the flow rates of the test solution and compressed air, the pressure of compressed air, and the pressure of the test solution in the nozzle, and the test solution was jetted onto the dummy sample. After the jetting was stopped, the buttons "Return", "Completed", and "Confirm" on the control panel were pressed in this order.

(1) Calibration

An acrylic plate with a thickness of 4 mm, which was a calibration sample, was fixed to the sample mount of the measuring device via a double-sided tape ("Kapton double-stick tape", product number: P-223 1-6299-01, manufactured by Nitto Denko America). The acrylic plate is a PMMA plate.

Next, the sample mount having the acrylic plate fixed was set on the measuring device.

Next, a micro gauge was unlocked and the height of the sample mount was adjusted with a height gauge. The distance between the jetting hole of the measuring device and the acrylic plate was adjusted to 4 mm.

Next, the button "To the processing condition input screen" on the control panel of the main unit of the measuring device was pressed, and the "Number of steps: 1, Specified jetting amount g×1 time" was then set. The jetting amount was set to 4 g.

Next, the buttons "Setting completed", "Start operation", and "Yes" of the control panel were pressed in this order. The flow rates of the test solution and compressed air, the pressure of compressed air, and the pressure of the test solution in the nozzle were maintained at the values entered in "(0-2) Distributed operation".

Next, the "Online" button on the control screen of the data processing PC was clicked to turn off the online mode and change to the offline mode.

Next, the "Descend" button on the control screen was clicked to move downward the stylus of the stylus-type step profiler in the cross-sectional profile acquisition unit.

Next, the micro gauge was confirmed to be unlocked, and the micro gauge was then turned toward the upward direction. At that time, the red arrow on the monitor was adjusted to be at the middle level. The above adjustment enables the stylus of the stylus-type step profiler to be in contact with the surface of the calibration sample, so that the zero point of the z axis, namely the height direction, can be adjusted.

Next, the micro gauge was switched from the unlocked (off) to on state.

Next, the "Ascend" button was clicked to move upward the stylus of the stylus-type step profiler in the cross-sectional profile acquisition unit.

Next, the "Offline" button on the control screen of the data processing PC was clicked to turn off the offline mode and change to the online mode.

Next, the cover of the main unit of the measuring device was closed, the button "Confirm" on the control panel of the main unit of the measuring device was pressed, and 4 g of the test solution was jetted.

The jetting of the test solution was stopped, "Perform" was then clicked, and the erosion rate was calculated. When the erosion rate was within 1.88 (μm/g)±5% as a reference, the calibration was ended. When the erosion rate was deviated from the above range, the flow rate of the test solution, the flow rate of compressed air, the pressure of compressed air, and the pressure of the test solution in the nozzle were adjusted. In this way, the calibration was repeated until the erosion rate reached the above range.

(2) Measurement of Erosion Rate of Each Sample (2-1) Mounting of Sample

Each sample (polyester films 1 to 5 in the section "2" below) was laminated onto a stainless steel plate to prepare a laminate. The laminate was fixed to the sample mount via a double-sided tape ("Kapton double-stick tape", product number: P-223 1-6299-01, manufactured by Nitto Denko America). The sample was 1 cm×1 cm in size.

Next, the sample mount was set on the measuring device.

Next, a micro gauge was unlocked and the height of the sample mount was adjusted with a height gauge. The distance between the jetting hole of the measuring device and the plastic film was adjusted to 4 mm.

Next, the button "To the processing condition input screen" on the control panel of the main unit of the measuring device was pressed. After that, the number of steps was entered, and the jetting amount of the test solution (g/jetting) was entered for each step. The jetting amount per step was in the range of 0.5 g or more and 3.0 g or less. The flow rates of the test solution and compressed air, the pressure of compressed air, and the pressure of the test solution in the nozzle were maintained at the conditions that had passed in the "(1) Calibration".

Next, the buttons "Setting completed", "Start operation", and "Yes" of the control panel were pressed in this order.

Next, the "Online" button on the control screen of the data processing PC was clicked to turn off the online mode and change to the offline mode.

Next, the "Descend" button on the control screen was clicked to move downward the stylus of the stylus-type step profiler in the cross-sectional profile acquisition unit.

Next, the micro gauge was confirmed to be unlocked, and the micro gauge was then turned toward the upward direction. At that time, the red arrow on the monitor was adjusted to be at the middle level. The above adjustment enables the stylus of the stylus-type step profiler to be in contact with the surface of the calibration sample, so that the zero point of the z axis, namely the height direction, can be adjusted.

Next, the micro gauge was switched from the unlocked (off) to on state.

Next, the "Ascend" button was clicked to move upward the stylus of the stylus-type step profiler in the cross-sectional profile acquisition unit.

Next, the "Offline" button on the control screen of the data processing PC was clicked to turn off the offline mode and change to the online mode.

(2-2) Start of Measurement

The cover of the main unit of the measuring device was closed. The button "Confirm" on the control panel of the main unit of the measuring device was pressed. While one cycle consisted of jetting of the test solution and measurement of the cross-sectional profile, the cycle was repeated until the depth of the cross-sectional profile exceeded 20 μm. Specifically, the cycle was repeated until the depth of the cross-sectional profile reached the depth of 25 μm or more and 30 μm or less.

After the measurement, the attached software "MseCalc" was started and "Analysis method" was clicked. Next, "Average value analysis" was clicked. Next, the "Add" button on the average value analysis screen was clicked twice. Then, "A-1" and "A-2" were displayed in the section of analysis name. The "Criteria" of "A-1" was double-clicked to display "O" in the criteria section.

Next, the "A-1" on the average value analysis screen was clicked to activate it, and the position of the X-axis position bar was controlled. The position of the position bar was determined at the point where the plastic film was not worn in the cross-sectional profile screen.

Next, the "A-2" on the average value analysis screen was clicked to activate it, and the position of the X-axis position bar was controlled. The position of the position bar was determined at the deepest point where the plastic film was worn in the cross-sectional profile screen.

Next, the cross-sectional profile and erosion rate data for each step were output in csv format, and the erosion rate $E_{0-20}$ was calculated. Specifically, the erosion rate $E_{0-20}$ was calculated by averaging the "erosion rates (corrected)" of the csv output data, the depth of which was 0 μm or more and 20 μm or less. Table 2 shows the results.

2. Production and Preparation of Plastic Film

[Polyester Film 1]

1 kg of PET (melting point 258° C., absorption center wavelength: 320 nm) and 0.1 kg of ultraviolet absorber (2,2'-(1,4-phenylene)bis(4H-3,1-benzoxazinone-4-one) were melt-mixed in a kneader at 280° C. to produce pellets containing an ultraviolet absorber. The pellet and PET with a melting point of 258° C. were fed into a single screw extruder, melt-kneaded at 280° C., and extruded through a T-die to obtain a casting film by casting on a cast drum with a controlled surface temperature of 25° C. The amount of UV absorber in the casting film was 1 part by mass with respect to 100 parts by mass of PET.

The resulting casting film was heated by a group of rolls set at 95° C. and then stretched 3.3 times in the flow direction while both front and back sides of the film were heated by a radiation heater so that the film temperature at the 250-mm point in the 400-mm stretching section was 103° C. The film was then once cooled to obtain a uniaxially stretched film. The stretching section has a start point with a stretching roll A and an end point with a stretching roll B. The stretching rolls A and B each have two nip rolls. During heating with the radiation heater, turbulence was created on the front and back surfaces of the film by blowing air at 92° C. and 4 m/s from the opposite side of the film of the radiation heater toward the film, so that the temperature uniformity of the film was disturbed.

Subsequently, corona discharge treatment was applied to both sides of this uniaxially stretched film in air to set the wetting tension of the base film to 55 mN/m. Next, both sides of the film, which surfaces were subjected to corona discharge treatment, were in-line coated with a "slippery layer coating solution containing a polyester resin with a glass transition temperature of 18° C., a polyester resin with a glass transition temperature of 82° C., and silica particles with an average particle size of 100 nm" to form a slippery layer.

Next, the uniaxially stretched film was guided to a tenter, preheated with hot air at 95° C., and stretched 4.5 times in the film width direction at 105° C. in the first step and 140° C. in the second step. Here, when the transverse stretching section was divided into two sections, the film is stretched in two steps so that the amount of film stretching at the midpoint of the transverse stretching section is 80% of the amount of stretching at the end of the transverse stretching section. The "amount of stretching" mentioned above means the difference between the film width at the measurement point and the film width before stretching. The film stretched in the width direction was heated, as it was, by hot air in the tenter. The temperature of the hot air was raised stepwise from 180° C. to 245° C., followed by 1% relaxation treatment in the width direction under the same temperature conditions, and further quenching to 100° C. and then 1% relaxation treatment in the width direction. Thereafter, film was wound up to obtain a biaxially stretched polyester film 1 with a thickness of 40 μm.

The polyester film 1 was used as the plastic film in Experimental Example 3.

[Polyester Film 2]

A biaxially stretched polyester film 2 with a thickness of 40 μm was obtained in the same manner as in the biaxially stretched polyester film 1, except that the stretching ratio in the width direction was changed from 4.5 times to 5.1 times. The polyester film 2 was used as the plastic film in Experimental Example 2.

[Polyester Film 3]

A commercially available biaxially stretched polyester film (TOYOBO CO., LTD.; product name: Cosmoshine A4300 with a thickness of 38 μm) was provided as a polyester film 3. The polyester film 3 was used as the plastic film in Experimental Example 1.

[Polyester Film 4]

A commercially available biaxially stretched polyester film (TOYOBO CO., LTD.; product name: Cosmoshine A4100 with a thickness of 50 μm) was provided as a polyester film 4. The polyester film 4 was used as the plastic film in Reference Example 1.

[Polyester Film 5]

A commercially available uniaxially stretched polyester film (TOYOBO CO., LTD.; product name: "Cosmoshine TA044" with a thickness of 80 μm) was provided as a polyester film 5. The polyester film 5 was used as the plastic film in Reference Example 2.

3. Synthesis of Compound

Compound α used in "4. Preparation of coating solution" was synthesized by the following protocol.

Air gas was introduced into a reaction vessel equipped with a stirrer, a thermometer, a cooling tube, and a nitrogen gas inlet tube. The pressure of the reaction vessel when air gas was introduced was controlled at 1.0 atm±0.1 atm. Next, to the reaction vessel were added 57 parts by mass of pentaerythritol triacrylate, 43 parts by mass of pentaerythritol tetraacrylate, 0.02 parts by mass of dibutyl tin dilaurate, 0.02 parts by mass of p-methoxyphenol, and 30 parts by mass of butyl acetate. The temperature was raised to 60° C. under a nitrogen flow while stirring. The pressure of the reaction vessel under the nitrogen flow was controlled at 1.2 atm±0.1 atm (The oxygen level in the reaction vessel can be lowered more efficiently by setting the pressure under the nitrogen flow to be higher than ambient pressure). Next, 30 parts by mass of hexamethylene diisocyanate was added to a dropping funnel and uniformly dripped into the reaction vessel over 1 hour. After the dripping, the temperature of the reaction vessel was raised to 75° C. and kept at 75±3° C. for 6 hours. Then, 150 parts by mass of methyl ethyl ketone was added to obtain a clear resin solution. Finally, the solvent was removed using an evaporator to obtain compound α. The compound α is an ionizing radiation curable compound. The number-average molecular weight of compound α was about 4500.

4. Preparation of Coating Solution

Each coating solution used in "5. Production of optical film" was prepared.

<Coating Solution a for Forming Hard Coating Layer>

Ionizing radiation curable compound 1: 0.6 parts by mass (compound α synthesized in the section "3")

Ionizing radiation curable compound 2: 0.2 parts by mass (Daicel Corporation; product name "EBECRYL230" with a solid content of 100%)

Ionizing radiation curable compound 3: 0.2 parts by mass (Kyoeisha Chemical Co., Ltd.; product name "Light Acrylate IAA" with a solid content of 100%)

Leveling agent: 0.01 parts by mass (Dainichiseika Color & Chemicals Mfg. Co., Ltd.; product name "10-28 (TL)" with a solid content of 10 mass %)
Photopolymerization initiator: 0.1 parts by mass (IGM Resins B.V.; product name "Omnirad 184")
Solvent
(A 5:5 mixed solvent of methyl isobutyl ketone and cyclohexanone. The solvent was used in an amount that made the solid content of the coating solution 35 mass %.)
<Coating Solution B for Forming Hard Coating Layer>
Ionizing radiation curable compound 1: 1 part by mass (compound α synthesized in the section "3")
Acrylic resin particles: 0.1 parts by mass (average particle size: 2 μm; refractive index: 1.535)
Leveling agent: 0.01 parts by mass (Dainichiseika Color & Chemicals Mfg. Co., Ltd.; product name "10-28 (TL)" with a solid content of 10 mass %)
Photopolymerization initiator: 0.1 parts by mass (IGM Resins B.V.; product name "Omnirad 184")
Solvent
(A 5:5 mixed solvent of methyl isobutyl ketone and cyclohexanone. The solvent was used in an amount that made the solid content of the coating solution 35 mass %.)
<Coating Solution C for Forming Hard Coating Layer>
Ionizing radiation curable compound 1: 0.625 parts by mass (compound α synthesized in the section "3")
Ionizing radiation curable compound 4: 0.375 parts by mass (Arakawa Chemical Industries, Ltd.; product name "OPSTAR Z7415" with a solid content of 100%)
Leveling agent: 0.01 parts by mass (Dainichiseika Color & Chemicals Mfg. Co., Ltd.; product name "10-28 (TL)" with a solid content of 10 mass %)
Photopolymerization initiator: 0.1 parts by mass (IGM Resins B.V.; product name "Omnirad 184")
Solvent
(A 5:5 mixed solvent of methyl isobutyl ketone and cyclohexanone. The solvent was used in an amount that made the solid content of the coating solution 35 mass %.)
<Coating Solution i for Forming Low-Refractive Index Layer>
Ultraviolet curable acrylate-containing composition: 1 parts by mass (Nippon Kayaku Co., Ltd., product name "KAYARAD PET-30", solid content: 100%)
Photopolymerization initiator: 0.1 parts by mass (IGM Resins B.V., product name "Omnirad 127")
Hollow silica particles: 1.3 parts by mass (average primary particle size: 60 nm)
Solid silica particles: 0.7 parts by mass (average primary particle size: 15 nm)
Leveling agent: 0.1 parts by mass (Shin-Etsu Chemical Co., Ltd.; product name "X-22-164E")
Solvent
(A 5:5 mixed solvent of methyl isobutyl ketone and cyclohexanone. The solvent was used in an amount that made the solid content of the coating solution 2 mass %.)
<Coating Solution ii for Forming Low-Refractive Index Layer>
UV-curable acrylate-containing composition: 1 part by mass (Nippon Kayaku Co., Ltd.; product name "KAYARAD PET-30"; solid content 100%)
Photopolymerization initiator: 0.1 parts by mass (IGM Resins B.V.; product name "Omnirad 127")
Hollow silica particles: 1.55 parts by mass (average primary particle size: 60 nm)
Solid silica particles: 0.45 parts by mass (average primary particle size: 15 nm)
Leveling agent: 0.1 parts by mass (Shin-Etsu Chemical Co., Ltd.; product name "X-22-164E")
Solvent
(A 5:5 mixed solvent of methyl isobutyl ketone and cyclohexanone. The solvent was used in an amount that made the solid content of the coating solution 2 mass %.)
<Coating Solution iii for Forming Low-Refractive Index Layer>
UV-curable acrylate-containing composition: 1 part by mass (Nippon Kayaku Co., Ltd.; product name "KAYARAD PET-30"; solid content 100%)
Photopolymerization initiator: 0.1 parts by mass (IGM Resins B.V.; product name "Omnirad 127")
Hollow silica particles: 2 parts by mass (average primary particle size: 60 nm)
Leveling agent: 0.1 parts by mass (Shin-Etsu Chemical Co., Ltd.; product name "X-22-164E")
Solvent
(A 5:5 mixed solvent of methyl isobutyl ketone and cyclohexanone. The solvent was used in an amount that made the solid content of the coating solution 2 mass %.)
5. Production of Optical Film Experimental Example 1-1

The polyester film 3 prepared in the section "2" was provided as the optical film in Experimental Example 1-1. The optical film in Experimental Example 1-1 has neither a hard coating layer nor a low-refractive index layer on the polyester film 3.

Experimental Example 1-2

The coating solution A for forming a hard coating layer was applied on the polyester film 3 prepared in the section "2", and then dried at 70° C. x 1 minute to volatilize the solvent. UV irradiation (100 mJ/cm$^2$) was then applied to form a hard coating layer (with a dry thickness of 10 μm).
The coating solution i for forming a low-refractive index layer was applied on the hard coating layer, and then dried at 60° C.×1 minute to volatilize the solvent. UV irradiation (200 mJ/cm$^2$) was then applied to form a low-refractive index layer (with a dry thickness of 100 nm) to obtain the optical film of Experimental Example 1-2.

Experimental Example 1-3 or 1-4

An optical film in Experimental Example 1-3 or 1-4 was obtained in the same manner as in Experimental Example 1-2, except that the coating solution for forming a hard coating layer and the coating solution for forming a low-refractive index layer used were those listed in Table 1.

Experimental Example 1-5

An optical film in Experimental Example 1-5 was obtained in the same manner as in Experimental Example 1-2, except that the hard coating layer was not formed and the low-refractive index layer was formed directly on the polyester film, and the coating solution for forming the low-refractive index layer used was the coating solution listed in Table 1.

Experimental Example 2-1

The polyester film 2 prepared in the section "2" was provided as the optical film in Experimental Example 2-1.

The optical film in Experimental Example 2-1 has neither a hard coating layer nor a low-refractive index layer on the polyester film 2.

Experimental Example 2-2

An optical film in Experimental Example 2-2 was obtained in the same manner as in Experimental Example 1-2, except that the polyester film 3 was changed to the polyester film 2.

Experimental Example 2-3 or 2-4

An optical film in Experimental Example 2-3 or 2-4 was obtained in the same manner as in Experimental Example 2-2, except that the coating solution for forming a hard coating layer and the coating solution for forming a low-refractive index layer used were those listed in Table 1.

Experimental Example 2-5 or 2-6

An optical film in Experimental Example 2-5 or 2-6 was obtained in the same manner as in Experimental Example 2-2, except that the hard coating layer was not formed and the low-refractive index layer was formed directly on the polyester film, and the coating solution for forming the low-refractive index layer used was the coating solution listed in Table 1.

Experimental Example 3-1 or 3-2

An optical film in Experimental Example 3-1 or 3-2 was obtained in the same manner as in Experimental Example 1-2, except that the polyester film 3 was changed to the polyester film 1, and the coating solution for forming a hard coating layer and the coating solution for forming a low-refractive index layer used were those listed in Table 1.

Experimental Example 3-3

An optical film in Experimental Example 3-3 was obtained in the same manner as in Experimental Example 1-2, except that the polyester film 3 was changed to the polyester film 1, the hard coating layer was not formed, the low-refractive index layer was formed directly on the polyester film, and the coating solution for forming a low-refractive index layer used was the coating solution listed in Table 1.

TABLE 1

| | | Polyester film | Coating solution for forming a hard coating layer | Coating solution for forming a low-refractive index layer | n1 | n2 | n2/n1 | Y value (%) | $\Sigma_T$ | a*max − a*min | b*max − b*min |
|---|---|---|---|---|---|---|---|---|---|---|---|
| Experimental Example | 1-1 | 3 | — | — | — | — | — | — | 0.98 | 0.500 | |
| | 1-2 | | A | i | 1.38 | 1.49 | 1.08 | 1.5 | 0.10 | 0.190 | 0.330 |
| | 1-3 | | B | ii | 1.36 | 1.52 | 1.12 | 1.2 | 0.10 | 0.200 | 0.150 |
| | 1-4 | | C | i | 1.38 | 1.57 | 1.14 | 1.0 | 0.11 | 0.200 | 0.150 |
| | 1-5 | | — | iii | 1.32 | 1.62 | 1.23 | 0.5 | 0.03 | 0.200 | 0.360 |
| | 2-1 | 2 | — | — | — | — | — | — | 0.37 | 0.490 | 0.480 |
| | 2-2 | | A | i | 1.38 | 1.49 | 1.08 | 1.5 | 0.06 | 0.180 | 0.190 |
| | 2-3 | | B | ii | 1.36 | 1.52 | 1.12 | 1.2 | 0.08 | 0.190 | 0.120 |
| | 2-4 | | C | i | 1.38 | 1.57 | 1.14 | 1.0 | 0.09 | 0.180 | 0.220 |
| | 2-5 | | — | iii | 1.32 | 1.62 | 1.23 | 0.5 | 0.04 | 0.240 | 0.370 |
| | 2-6 | | — | ii | 1.36 | 1.62 | 1.19 | 0.7 | 0.06 | 0.220 | 0.320 |
| | 3-1 | 1 | B | ii | 1.36 | 1.52 | 1.12 | 1.2 | 0.07 | 0.170 | 0.120 |
| | 3-2 | | C | i | 1.38 | 1.57 | 1.14 | 1.0 | 0.08 | 0.250 | 0.080 |
| | 3-3 | | — | iii | 1.32 | 1.62 | 1.23 | 0.5 | 0.04 | 0.210 | 0.500 |

| | | $S_{MAX}$ | $\Sigma_T \times R$ | Rainbow unevenness | Color tone uniformity | Color saturation (5 degrees) | Color saturation (50 degrees) | Color saturation (70 degrees) |
|---|---|---|---|---|---|---|---|---|
| Experimental Example | 1-1 | 0.160 | — | C | A | — | — | — |
| | 1-2 | 0.045 | 0.150 | B | A | 2.1 | 9.2 | 0.4 |
| | 1-3 | 0.023 | 0.120 | A | A | 11.7 | 28.0 | 1.8 |
| | 1-4 | 0.032 | 0.110 | A | B | 15.6 | 38.8 | 2.5 |
| | 1-5 | 0.007 | 0.015 | AA | E | 35.5 | 110.5 | 5.4 |
| | 2-1 | 0.063 | — | B | A | — | — | — |
| | 2-2 | 0.016 | 0.090 | AA | A | 2.1 | 9.2 | 0.4 |
| | 2-3 | 0.015 | 0.096 | AA | A | 11.7 | 28.0 | 1.8 |
| | 2-4 | 0.039 | 0.090 | AA | B | 15.6 | 38.8 | 2.5 |
| | 2-5 | 0.010 | 0.020 | AA | E | 35.5 | 110.5 | 5.4 |
| | 2-6 | 0.010 | 0.036 | AA | C | 28.6 | 65.4 | 3.3 |
| | 3-1 | 0.013 | 0.084 | AA | A | 11.7 | 28.0 | 1.8 |
| | 3-2 | 0.020 | 0.080 | AA | B | 15.6 | 38.8 | 2.5 |
| | 3-3 | 0.006 | 0.020 | AA | E | 35.5 | 110.5 | 5.4 |

TABLE 2

|  |  | Polyester film 1 Film of Experimental Example 3 | Polyester film 2 Film of Experimental Example 2 | Polyester film 3 Film of Experimental Example 1 | Polyester film 4 Film of Reference Example 1 | Polyester film 5 Film of Reference Example 2 |
|---|---|---|---|---|---|---|
| In-plane phase difference (nm) | Re1 | 459 | 1213 | 1409 | 2181 | 8125 |
|  | Re2 | 453 | 1190 | 1428 | 2196 | 8287 |
|  | Re3 | 450 | 1201 | 1419 | 2204 | 8221 |
|  | Re4 | 458 | 1196 | 1446 | 2210 | 8321 |
|  | Re5 | 455 | 1189 | 1445 | 2218 | 8329 |
|  | Average of Re | 455 | 1198 | 1429 | 2202 | 8257 |
| Slow axis direction (degree) | D1 | 82.00 | 83.00 | 59.22 | 58.37 | 89.51 |
|  | D2 | 86.00 | 85.00 | 58.75 | 58.06 | 89.44 |
|  | D3 | 86.00 | 81.00 | 58.55 | 58.24 | 89.55 |
|  | D4 | 85.00 | 80.00 | 59.38 | 58.05 | 89.87 |
|  | D5 | 79.00 | 84.00 | 59.15 | 56.88 | 89.55 |
|  | Maximum value − Minimum value | 7.00 | 5.00 | 0.83 | 1.49 | 0.43 |
| Phase difference in thickness direction (nm) | Rth1 | 5900 | 6931 | 5447 | 8017 | 8240 |
|  | Rth2 | 6015 | 6959 | 5503 | 7955 | 6883 |
|  | Rth3 | 6061 | 6747 | 5370 | 7869 | 7176 |
|  | Rth4 | 5966 | 6913 | 5328 | 7925 | 7890 |
|  | Rth5 | 5990 | 6718 | 5402 | 8014 | 7862 |
|  | Average of Rth | 5986 | 6854 | 5410 | 7956 | 7610 |
| Re/Rth | Re1/Rth1 | 0.078 | 0.175 | 0.259 | 0.272 | 0.986 |
|  | Re2/Rth2 | 0.075 | 0.171 | 0.259 | 0.276 | 1.204 |
|  | Re3/Rth3 | 0.074 | 0.178 | 0.264 | 0.280 | 1.146 |
|  | Re4/Rth4 | 0.077 | 0.173 | 0.271 | 0.279 | 1.055 |
|  | Re5/Rth5 | 0.076 | 0.177 | 0.267 | 0.277 | 1.059 |
|  | Average of Re/Rth | 0.076 | 0.175 | 0.264 | 0.277 | 1.090 |
| Folding resistance (TD) |  | 10 degrees | 10 degrees | 0 degrees | 0 degrees | Breakage |
| Folding resistance (MD) |  | 10 degrees | 10 degrees | 30 degrees | 30 degrees | 55 degrees |
| $E_{0-20}$ (μm/g) |  | 1.92 | 1.53 | 0.99 | 1.07 | 1.03 |
| Pencil hardness |  | F | HB | 3B | 2B | 2B |

The results of Table 1 have successfully demonstrated that the optical film with an $\Sigma_T$ of more than 0.04 and less than 0.20 can eliminate rainbow unevenness when viewed with the naked eyes and provide favorable color tone uniformity when viewed at an oblique angle. Among the Experimental Examples in Table 1, those corresponding to the Examples are the Experimental Examples 1-2, 1-3, 1-4, 2-2, 2-3, 2-4, 2-6, 3-1, and 3-2.

The results of Tables 1 and 2 have also successfully demonstrated that the value of $\Sigma_T$ can be easily set to an appropriate value in "those with a small in-plane phase difference of the plastic film" and "those with a large difference between the maximum and minimum values in the slow axis direction of the plastic film".

In addition, the results of Table 2 have also successfully demonstrated that the polyester films 1 and 2 can suppress a folding habit remaining after a folding test or breakage, regardless of the folding direction. The polyester films 1 and 2 are "those with a large difference between the maximum and the minimum values in the slow axis direction of the plastic film".

Further, the polyester films 1 and 2 were found to cause no microcracks after the folding test. The microcracks can be observed as follows.

Microcracks can be observed under a digital microscope. Examples of the digital microscope include the product name "VHX-5000" manufactured by Keyence Corporation.

The microcracks should be observed in a dark field by using reflected light while ring illumination is selected as the illumination of the digital microscope. Specifically, first, the sample after the folding test is slowly unfolded, and the sample is then fixed, using a tape, on the stage of the microscope. At that time, when the folding habit is strong, the area to be observed should be flattened as much as possible. During the above-mentioned operations, pay attention such that the folding portion of the sample, which portion is an area to be evaluated, should not be touched with a finger and no force should be applied to the folding portion. Both the inner and outer portions during the folding test should be evaluated.

The microcracks are observed in a light room with white illumination (illuminance of 1000 lux to 2000 lux).

REFERENCE SIGNS LIST

10: Plastic film
20: Hard coating layer
30: Low-refractive index layer
100: Optical film
200: Surface light source
300: Polarizer
400: Adhesive layer
500: First transparent protective plate
600: Second transparent protective plate
700: Polarizing plate
800: Display element
1000: Image display device
A1: Light source
A2: Detector
S: Slow axis
F: Fast axis
V: Vibration direction of light L1
11: Container
12: Receptor
21: Piping for test solution
22: Piping for compressed air
23: Return piping
24: Return pump 31, 32: Flowmeter
41, 42: Pressure gauge
50: Jetting section
51: Nozzle
52: Housing
60: Cross-sectional profile acquisition unit
70: Plastic film
81: Sample mount
82: Support
90: Erosion rate measuring device
A1: Water
A2: Spherical silica
A3: Air
A4: Worn plastic film

The invention claimed is:

1. An optical film comprising a low-refractive index layer on a plastic film, wherein
the plastic film has a slow axis that is an axis with a largest refractive index in a plane, and a fast axis that is an axis orthogonal to the slow axis in the plane of the plastic film,
the low-refractive index layer is located on a surface of the optical film, and
the optical film comprises a region in which $\Sigma_T$ calculated from the following measurement condition 1 satisfies more than 0.04 and less than 0.20:
<Measurement Condition 1>
when linearly polarized light is incident from a surface on a side opposite to the low-refractive index layer of the optical film; the linearly polarized light that is incident light is defined as light L1; transmitted light that is the light L1 transmitting through the optical film is defined as light L2;
the light L1 is incident on the optical film at angles disposed such that an elevation angle in a vibration direction of the light L1 with respect to the plane of the optical film is 50 degrees or more and 70 degrees or less while an angle formed by the slow axis and the vibration direction of the light L1 is fixed at 45 degrees; the elevation angle is varied in a range of 50 degrees or more and 70 degrees or less by every 2 degrees, and the light L2 is subject to measurements at 11 different elevation angles; the light L2 is measured at 11 measurement points as in the measurements;
the light L2 is subject to conversion into conditions of a C light source and at a viewing angle of 2 degrees; a* value and b* value at an $n^{th}$ measurement point among the 11 measurement points of the light L2 and in an L*a*b* color system are defined as a*n and b*n, respectively; a* value and b* value at an $(n+1)^{th}$ measurement point among the 11 measurement points of the light L2 and in the L*a*b* color system are also defined as a*n1 and b*n1, respectively; and
the measurements at the 11 measurement points are used to calculate a sum of square of a difference in a* between adjacent measurement points and square of a difference in b* between the adjacent measurement points; and the sum is calculated for each of 10 adjacent points and $\Sigma_T$ indicating a total of the sums is calculated, the $\Sigma_T$ can be expressed by the following formula 1:

$$\Sigma_T = \Sigma[\{a^*n - a^*n1\}^2 + \{b^*n - b^*n1\}^2] \quad \text{(formula 1)}.$$

2. The optical film according to claim 1, wherein when a maximum value of a* is defined as a*max, a minimum value of a* as a*min, a maximum value of b* as b*max, and a minimum value of b* as b*min based on the measurements at the 11 measurement points, the following formulas 2-1 and 2-2 are satisfied:

$$a^*\text{max} - a^*\text{min} \leq 0.250 \quad \text{(formula 2-1); and}$$

$$b^*\text{max} - b^*\text{min} \leq 0.350 \quad \text{(formula 2-2)}.$$

3. The optical film according to claim 1, wherein when the measurements at the 11 measurement points are used to calculate a sum of square of a difference in a* between adjacent measurement points and square of a difference in b* between the adjacent measurement points, and when the sum is defined as S, S can be expressed by the following formula 3; and when S is calculated for each of 10 adjacent points and a maximum value of S among the 10 points is defined as $S_{MAX}$, $S_{MAX}$ is 0.010 or more and 0.050 or less:

$$S = \{a^*n - a^*n1\}^2 + \{b^*n - b^*n1\}^2 \quad \text{(formula 3)}.$$

4. The optical film according to claim 1, wherein when a visual reflectance Y value of the optical film is defined as R (%), a product of R and $\Sigma_T$ is 0.05 or more and 0.25 or less.

5. The optical film according to claim 1, wherein when an average refractive index of the low-refractive index layer is defined as n1 and an average refractive index of a layer adjacent to the low-refractive index layer is defined as n2, n2/n1 is less than 1.23.

6. The optical film according to claim 1, wherein when an average refractive index of the low-refractive index layer is defined as n1 and an average refractive index of a layer adjacent to the low-refractive index layer is defined as n2, n2/n1 is 1.05 or more and less than 1.23.

7. The optical film according to claim 1, wherein an in-plane phase difference of the plastic film is 2500 nm or less.

8. The optical film according to claim 1, wherein the plastic film satisfies the following condition A:
when a sample of 50 mm in vertical×50 mm in horizontal in size is cut out from the plastic film; a total of five points are selected as measurement points, including 1 point at a center of the sample and 4 points at 10 mm from four corners of the sample toward the center; and
when slow axis directions at the five points of the sample are measured; and angles formed by any side of the sample with the slow axis direction at the measurement points are respectively defined as D1, D2, D3, D4, and D5, a difference between a maximum value of D1 to D5 and a minimum value of D1 to D5 is 1.5 degrees or more.

9. The optical film according to claim 1, comprising, between the plastic film and the low-refractive index layer, one or more layers selected from the group consisting of a hard coating layer and an anti-glare layer.

10. A polarizing plate comprising: a polarizer; a first transparent protective plate disposed on one side of the polarizer; and a second transparent protective plate disposed on the other side of the polarizer, wherein at least one selected from the group consisting of the first transparent protective plate and the second transparent protective plate is the optical film according to claim 1, and a surface on the low-refractive index layer side of the optical film faces a side opposite to the polarizer.

11. An image display device comprising: a display element; and a polarizer and an optical film disposed on a light emitting surface side of the display element, wherein the optical film is the optical film according to claim 1, and a surface on the low-refractive index layer side of the optical film faces a side opposite to the display element.

12. A method for selecting an optical film of an image display device comprising a display element, and a polarizer and an optical film disposed on a light emitting surface side of the display element, the method comprising selecting, as the optical film, an optical film X satisfying the following determination conditions (1) to (4);
  condition (1) the optical film X comprises a low-refractive index layer on a plastic film;
  condition (2) the plastic film has a slow axis that is an axis with a largest refractive index in a plane, and a fast axis that is an axis orthogonal to the slow axis in the plane of the plastic film;
  condition (3) the low-refractive index layer is located on a surface of the optical film X; and
  condition (4) the optical film X comprises a region in which $\Sigma_T$ calculated from the following measurement condition 1 satisfies more than 0.04 and less than 0.20:
<Measurement Condition 1>
  when linearly polarized light is incident from a surface on a side opposite to the low-refractive index layer of the optical film; the linearly polarized light that is incident light is defined as light L1; transmitted light that is the light L1 transmitting through the optical film is defined as light L2;
  the light L1 is incident on the optical film at angles disposed such that an elevation angle in a vibration direction of the light L1 with respect to the plane of the optical film is 50 degrees or more and 70 degrees or less while an angle formed by the slow axis and the vibration direction of the light L1 is fixed at 45 degrees; the elevation angle is varied in a range of 50 degrees or more and 70 degrees or less by every 2 degrees, and the light L2 is subject to measurements at 11 different elevation angles; the light L2 is measured at 11 measurement points as in the measurements;
  the light L2 is subject to conversion into conditions of a C light source and at a viewing angle of 2 degrees; a* value and b* value at an $n^{th}$ measurement point among the 11 measurement points of the light L2 and in an L*a*b* color system are defined as a*n and b*n, respectively; a* value and b* value at an $(n+1)^{th}$ measurement point among the 11 measurement points of the light L2 and in the L*a*b* color system are also defined as a*n1 and b*n1, respectively; and
  the measurements at the 11 measurement points are used to calculate a sum of square of a difference in a* between adjacent measurement points and square of a difference in b* between the adjacent measurement points; and the sum is calculated for each of 10 adjacent points and $\Sigma_T$ indicating a total of the sums is calculated, the $\Sigma_T$ can be expressed by the following formula 1:

$$\Sigma_T = \Sigma[\{a*n - a*n1\}^2 + \{b*n - b*n1\}^2] \qquad \text{(formula 1)}.$$

* * * * *